(12) United States Patent
Cheng et al.

(10) Patent No.: US 12,360,179 B2
(45) Date of Patent: Jul. 15, 2025

(54) SYSTEM AND METHOD FOR MEASURING MAGNETIC FIELDS IN PVD SYSTEM

(71) Applicant: Taiwan Semiconductor Manufacturing Co., Ltd., Hsinchu (TW)

(72) Inventors: Wen-Hao Cheng, Hsinchu (TW); Hsuan-Chih Chu, Hsinchu (TW); Yen-Yu Chen, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 451 days.

(21) Appl. No.: 17/855,517

(22) Filed: Jun. 30, 2022

(65) Prior Publication Data

US 2024/0003993 A1    Jan. 4, 2024

(51) Int. Cl.
*H01J 37/34* (2006.01)
*G01R 33/02* (2006.01)
*G06N 5/022* (2023.01)
*H01J 37/32* (2006.01)
*H01L 21/66* (2006.01)

(52) U.S. Cl.
CPC ............. *G01R 33/02* (2013.01); *G06N 5/022* (2013.01); *H01J 37/32926* (2013.01); *H01J 37/32935* (2013.01); *H01J 37/3299* (2013.01); *H01J 37/3405* (2013.01); *H01J 37/345* (2013.01); *H01J 37/3455* (2013.01); *H01L 22/20* (2013.01)

(58) Field of Classification Search
CPC ........... H01J 37/32926; H01J 37/32935; H01J 37/3299; H01J 37/3405; H01J 37/345; H01J 37/3455; C23C 14/35; H01L 22/20; G01R 33/02; G06N 3/048; G06N 3/08
USPC ............................ 204/298.03, 192.13, 298.2
See application file for complete search history.

(56) References Cited

U.S. PATENT DOCUMENTS

2019/0066988 A1* 2/2019 He ........................ C23C 14/35

* cited by examiner

*Primary Examiner* — Rodney G McDonald
(74) *Attorney, Agent, or Firm* — Seed IP Law Group

(57) ABSTRACT

A thin-film deposition system includes a thin-film deposition chamber. A magnetron assembly is positioned within the thin-film deposition chamber to assist in thin-film deposition processes. A magnetic sensor apparatus is positioned adjacent to the magnetron assembly. The magnetic sensor apparatus includes a plurality of magnetic sensors that each sense the magnetic field in a particular location within the thin-film deposition chamber. The control system generates a magnetic field distribution based on the sensor signals from the magnetic sensors. An analysis model that has been trained with a machine learning process analyzes the magnetic field distribution and determines whether or not an abnormal magnetic field distributions process. The control system can stop the thin-film deposition process based on the output of the analysis model.

20 Claims, 12 Drawing Sheets

SYSTEM AND METHOD FOR MEASURING MAGNETIC FIELDS IN PVD SYSTEM

BACKGROUND

There has been a continuous demand for increasing computing power in electronic devices including smart phones, tablets, desktop computers, laptop computers and many other kinds of electronic devices. Integrated circuits provide the computing power for these electronic devices. One way to increase computing power in integrated circuits is to increase the number of transistors and other integrated circuit features that can be included for a given area of semiconductor substrate.

Increasing the density of features in integrated circuits can be accomplished by decreasing the size of features in integrated circuits. To continue decreasing the size of features in integrated circuits, various thin-film deposition techniques are implemented to produce thin-films. These techniques can form very thin-films. However, thin-film deposition techniques also face serious difficulties in ensuring that the thin-films are properly formed.

As the size of features decrease in integrated circuits, the function of integrated circuits may be increasingly sensitive to the quality of the thin-films. Improperly formed thin-films can result in integrated circuits that function poorly or that do not function at all. This can lead to poor wafer yields.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
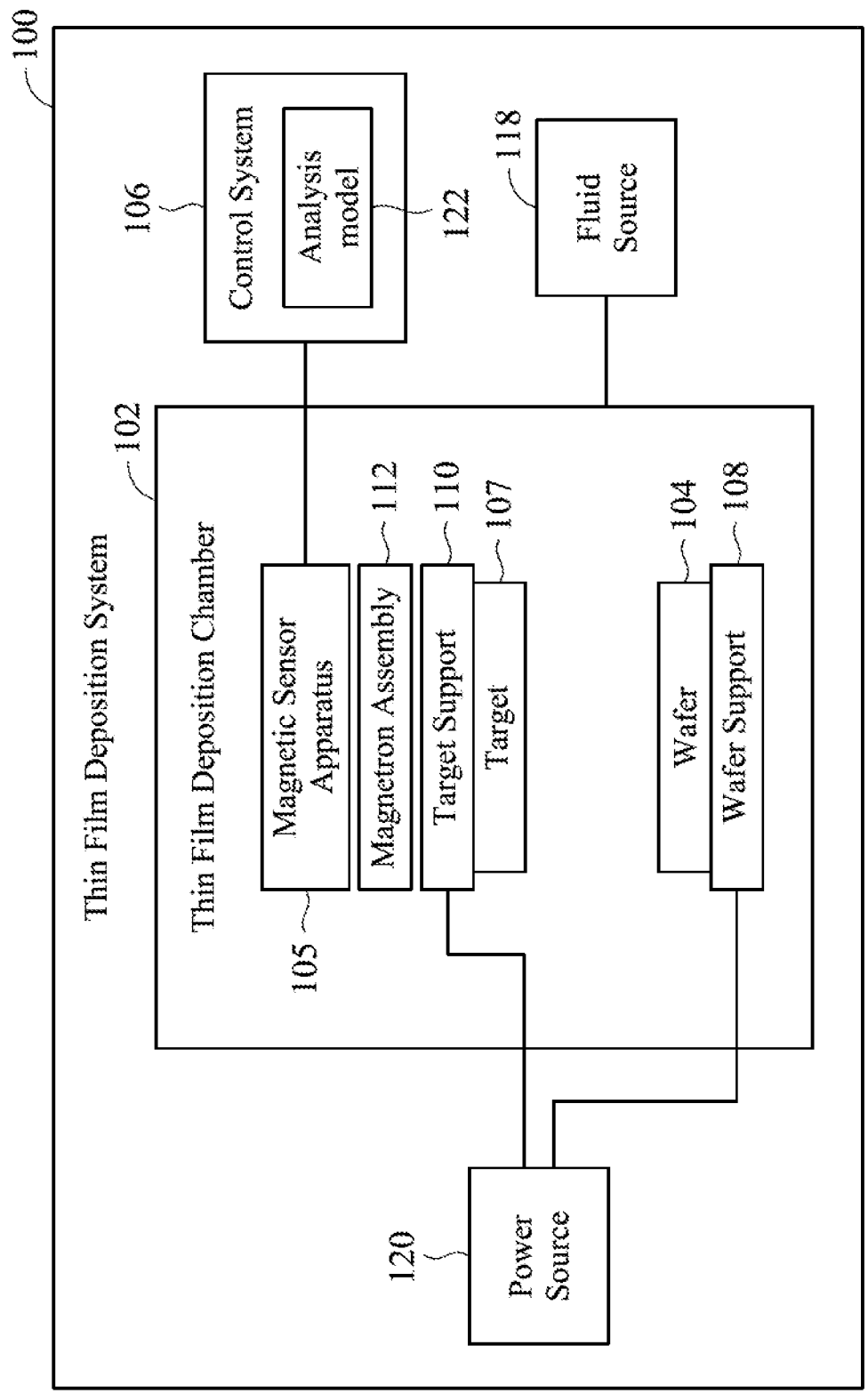
FIG. 1 is a block diagram of a thin-film deposition system, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In the following description, certain specific details are set forth in order to provide a thorough understanding of various embodiments of the disclosure. However, one skilled in the art will understand that the disclosure may be practiced without these specific details. In other instances, well-known structures associated with electronic components and fabrication techniques have not been described in detail to avoid unnecessarily obscuring the descriptions of the embodiments of the present disclosure.

Unless the context requires otherwise, throughout the specification and claims that follow, the word "comprise" and variations thereof, such as "comprises" and "comprising," are to be construed in an open, inclusive sense, that is, as "including, but not limited to."

The use of ordinals such as first, second and third does not necessarily imply a ranked sense of order, but rather may only distinguish between multiple instances of an act or structure.

Reference throughout this specification to "some embodiments" or "an embodiment" means that a particular feature, structure or characteristic described in connection with the embodiment is included in at least some embodiments. Thus, the appearances of the phrases "in some embodiments" or "in an embodiment" in various places throughout this specification are not necessarily all referring to the same embodiment. Furthermore, the particular features, structures, or characteristics may be combined in any suitable manner in one or more embodiments.

As used in this specification and the appended claims, the singular forms "a," "an," and "the" include plural referents unless the content clearly dictates otherwise. It should also be noted that the term "or" is generally employed in its sense including "and/or" unless the content clearly dictates otherwise.

Embodiments of the present disclosure help ensure that a thin-film deposition system is functioning properly by measuring, in situ, magnetic fields within a thin-film deposition chamber during a thin-film deposition process. Embodiments of the present disclosure provide a magnetic sensor apparatus that can be placed within a thin-film deposition chamber in order to detect the magnetic field distribution within the thin-film deposition chamber. Embodiments of the present disclosure also utilize machine learning techniques to train an analysis model to determine whether thin-film deposition processes are working properly or not based on the magnetic field distribution within the thin-film deposition chamber.

The combination of the magnetic sensor apparatus and the analysis model provide several benefits. For example, the analysis model can detect when a thin-film deposition process is likely to be faulty based on the magnetic field distribution and can stop thin-film deposition processes to adjust deposition parameters. The result is that thin-film deposition processes produce thin-films having thicknesses and compositions that reliably fall within target specifications. This further results in improved function of integrated circuits that include the thin-films and improved wafer yields.

FIG. 1 is a block diagram of a thin-film deposition system 100, in accordance with some embodiments. The thin-film deposition system 100 includes a thin-film deposition chamber 102. The thin-film deposition system 100 performs a thin-film deposition process on a wafer 104 within the thin-film deposition chamber 102. A magnetic sensor apparatus 105 is positioned within the thin-film deposition chamber 102. A control system 106 controls the thin-film deposition system 100. As will be set forth in more detail below, the magnetic sensor apparatus 105 and the control system 106 cooperate to ensure that thin-film deposition processes are correctly performed on the wafer 104.

In some embodiments, the thin-film deposition system 100 is physical vapor deposition (PVD) system. The PVD system may be a magnetron sputtering PVD system. The magnetron sputtering system is a type of physical vapor deposition (PVD) system that utilizes a magnetron assembly 112 to assist in performing thin-film deposition process. While some embodiments described herein are directed to a magnetron sputtering system, principles of the present disclosure can be utilized in accordance with thin-film deposition systems other than magnetron sputtering systems. Such other thin-film deposition systems fall within the scope of the present disclosure.

A wafer support 108 is positioned within the thin-film deposition chamber 102. The wafer support 108 supports the wafer 104 during thin-film deposition processes. At the beginning of a thin-film deposition process, a wafer 104 may be transferred into the thin-film deposition chamber 102 and positioned on the wafer support 108. After a thin-film deposition process is performed on the wafer 104, the wafer 104 can be transferred from the wafer support 108 out of the thin-film deposition chamber 102. The wafer can include a semiconductor wafer or another type of wafer.

In some embodiments, the wafer support 108 includes an electrode. As will be described in more detail below, voltages may be applied to the electrode as part of the thin-film deposition process. These voltages can include DC voltages, AC voltages, or combinations of DC offsets and AC voltages.

In some embodiments, the wafer support 108 includes a heater. The heater can heat the wafer 104 during thin-film deposition processes. Heating of the wafer 104 during thin-film deposition processes can help promote redistribution or settling of deposition materials on the surface of the wafer 104 to help ensure even thicknesses of the deposition material on the wafer 104.

The thin-film deposition system includes a target 107 held by a target support 110. The target 107 includes a target material. The target material is the material that will be utilized to form a thin-film on the exposed surface of the wafer 104 during a thin-film deposition process. Further details regarding the formation of the thin-film will be provided after description of some other components of the thin-film deposition system 100.

In the example of FIG. 1, the target 107 is held above the wafer 104 such that the bottom surface of the target 107 faces the top surface of the wafer 104. However, in other examples, the positions of the target support 110 and the wafer support 108 may be reversed such that the upward facing surface of the target 107 faces the downward facing surface of the wafer 104. Various other configurations and orientations of targets and wafers can be utilized without departing from the scope of the present disclosure.

The thin-film deposition system 102 includes a magnetron assembly 112. The magnetron assembly 112 includes an array of magnets. The magnets are arrayed in a selected pattern or arrangement to produce a desired magnetic field. The magnets of the magnetron assembly 112 produce a magnetic field in the vicinity of the target 107. The magnetic field has varying strength at different locations in the vicinity of the target 107. As used herein, the term "magnetic field distribution" can refer to the values of magnetic field strength, magnetic flux density, or magnetic field intensity at various locations within the thin-film deposition chamber 102.

The thin-film deposition system 102 includes a magnetic sensor apparatus 105. The magnetic sensor apparatus 105 is positioned within the thin-film deposition chamber 102 above the magnetron assembly 112. The magnetic sensor apparatus includes an array of magnetic sensors in various positions above the magnetron assembly 112. Each magnetic sensor senses the magnetic field at its particular position. The magnetic field values from each of the magnetic sensors collectively indicate a magnetic field distribution within the thin-film deposition chamber 102. As will be described in more detail below, the magnetic field distribution can be utilized to determine whether thin-film deposition process will be properly performed.

In some embodiments, the thin-film deposition system 100 performs a thin-film deposition processes by sputtering. In particular, when a thin-film deposition process is to be performed, a wafer 104 is transferred into the thin-film deposition chamber 102 and placed on the wafer support 108. A target support 110 including a downward facing target 107 is also loaded into the thin-film deposition chamber. The target 107 includes material that is to be deposited on the surface of the wafer 104 by sputtering.

A fluid source 118 supplies a fluid into the thin-film deposition chamber 102. In some embodiments, the fluid includes an inert gas, such as argon, or another inert gas. A power source 120 applies a voltage between the target support 110 and the wafer support 108. In this case, both the target support 110 and the wafer support 108 include electrodes or function, in part, as electrodes. In other cases, electrodes may be positioned in other locations within the thin-film deposition chamber 102. The applied voltage causes ionization of the atoms of the fluid. When the atoms of the fluid become ionized, they are drawn toward the target 107 via electrostatic force. For example, the target support 110 may receive a negative voltage that causes positively charged ions to be drawn toward the target 107. When the positively charged ions impact the target 107, the positively charged ions cause some of the material of the target 107 to be ejected from the target 107 and to travel toward the wafer 104. The ejected target material accumulates on the wafer, thereby forming a thin-film of the target material on the wafer 104.

The magnetron assembly 112 assists in the sputtering process. In particular, the magnetron assembly 112 generates a magnetic field having a selected shape and strength below the target. The magnetic field interacts with the ions and free electrons in a way that causes the ions to impact the target 107 primarily at selected locations. The target material is ejected from these locations, causing valleys within the target 107.

The shape and strength of the magnetic field determines the primary locations of ion impact on the target 107. However, if the magnetic field does not have the desired characteristics and shape, it is possible that the primary ion impact sites of the target 107 may occur at undesirable locations. The result may be uneven formation of the thin-film on the wafer 104. Furthermore, unduly large amounts of material may accumulate on the inner surfaces of the thin-film deposition chamber. Accordingly, it can be beneficial to ensure that the magnetic field generated by the magnetron assembly 112 has characteristics that will result in a desirable impact profile on the target 107. As used herein, the term "target profile" may refer to the shapes, depths, and locations of peaks and valleys in the target 107 as ion impacts cause ejection of target material.

To assist in ensuring that a desirable target profile and corresponding thin-film deposition occur, the magnetic sensor apparatus 105 is positioned within the thin-film deposition chamber 102. A plurality of magnetic sensors are positioned in an array above the magnetron assembly 112. Each of the magnetic sensors individually senses the magnetic field strength or intensity at its particular location. The magnetic sensors each output sensor signals indicative of the magnetic field strength at their particular locations.

The magnetic sensors of the magnetic sensor apparatus 105 provide their respective signals to the control system 106 or to a separate sensory system that then provides the signals to the control system 106. The control system 106 generates a magnetic field distribution or mapping based on the sensor signals provided by each of the individual sensors. The magnetic field distribution indicates the magnetic field strength or intensity at each of the locations of the magnetic sensors. The magnetic field distribution is based on the placement and strength of each of the magnets of the magnetron assembly 112. In some embodiments, the magnetic sensors are placed in horizontal plane above the magnetron assembly 112. Accordingly, the magnetic field distribution indicates the magnetic field strength of each of a plurality of points on the horizontal plane above the magnetron assembly 112.

As described in more detail in relation to FIGS. 2-9, in some embodiments, the magnetron assembly 112 includes a plurality of individual magnets. Each magnet generates its own magnetic field. The strength of the magnetic field at any given location within the thin-film deposition chamber is the sum of the magnetic fields from each of the magnets at that location. The magnetic sensor apparatus 105 includes an array of magnetic sensors. In one example, the magnetic sensors are distributed in a horizontal plane above the magnetron assembly. Each magnetic sensor senses the strength of the magnet field at that location. Each magnetic sensor generates sensor signals indicative of the magnetic field strength at the location of the sensor. The magnetic sensors may be arrayed in a horizontal plane above the magnetron assembly.

The control system 106 receives the sensor signals from each of the magnetic sensors. The control system 106 generates the magnetic field distribution based on the sensor signals. For example, the control system 106 knows the position of each magnetic sensor within the array. The magnetic field distribution may correspond to a grid of magnet field strength values. Each location on the grid corresponds to a position of one of the magnetic sensors within the array. Accordingly, the magnetic field distribution may correspond to the strength of the magnetic field at each of a plurality of locations corresponding to locations of the magnetic sensors. A non-limiting example of a magnetic field distribution is provided in relation to FIGS. 7A and 7B.

The control system 106 includes an analysis model 122. The analysis model 122 is a model that has been trained with a machine learning process to predict aspects of the target profile of the target 107 based on the magnetic field distribution. To assist in the machine learning process, training set data is gathered. The training set corresponds to magnetic field distributions and target profiles associated with a large number of previously performed thin-film deposition processes. The training set data can be gathered by generating a magnetic field distribution or mapping during each of a plurality of thin-film deposition processes. The training set data can be gathered also by measuring the target profile associated with the target in each of the thin-film deposition processes. The process of measuring the target profiles can include determining the locations and depths of the valleys within the target 107. The process of measuring the target profiles can also include determining whether or not the target profiles are acceptable. In some embodiments, determining whether or not the target profiles are acceptable can include measuring the profiles or thicknesses associated with thin-films formed by the thin-film deposition processes. The target profiles, or the classifications of whether or not a target profiles acceptable, are included in the training set data.

The machine learning process includes training the analysis model 122 to correctly predict the target profiles in the training set data based on the magnetic field distributions, or to correctly predict whether or not each magnetic field distribution in the training set data corresponds to an acceptable target profile. After the training process is complete, the analysis model 122 is capable of determining aspects of target profiles based on the magnetic field distribution.

As is described in further detail below in relation to FIGS. 2-9, in some embodiments a thin-film deposition process is performed by bombarding the target 107 with one or both of ions and charged particles. When the ions and charged particles impact the target 107, the material is ejected from the target 107 and accumulates on the surface of the wafer. The accumulation of target material on the wafer corresponds to deposition of the thin-film. The quality of the thin-film depends, in part, on the areas of the target 107 from which target material is ejected. The quality of the thin-film corresponds to the uniformity of thin-film material and the overall thickness of the thin-film material on the wafer 104. Trenches will form in the target 107 at locations from which large amounts of material is ejected. Because material is ejected by impact from ions and charged particles, the locations of the trenches correspond to the locations at which ions and charged particles impact the target 107.

The magnetic field generated by the magnetron assembly 112 affects the locations at which ions and charged particles impact the target 107. This is because ions and charged particles experience forces in the presence of a magnetic field. Accordingly, magnetic field distribution, i.e. the strength of the magnetic field at the locations adjacent to the target 107, affects the locations at which ions and charged particles are more likely to impact the target 107. Accordingly, the magnetic field distribution affects the quality of the thin-film is deposited on the wafer 104.

The training data for a machine learning process can be generated by performing a large number of thin-film deposition processes. For each thin-film deposition process, target trench data and magnetic field distribution data can be generated. The target trench data can include the location and depths of trenches in the target 107. The magnetic field distribution data can include the magnetic field distribution during the thin-film deposition process. The target trench data can be generated by measuring the depth and location of trenches in the target 107 after each thin-film deposition process. The target trench data can be labeled as acceptable or unacceptable for each process. Acceptability can be determined either by noting that the depth and placement of trenches correspond to locations and depths known to produce high-quality thin films. Alternatively, acceptability can be determined by measuring the quality of the thin-film produced in each thin-film deposition process.

The training process can include training the analysis model 122 to analyze each magnetic field distribution and to generate, for each magnetic field distribution, a classification indicating acceptable or unacceptable trench formation. The classification for each magnetic field distribution is then compared to the actual label from the target trench data. Internal functions of the analysis model are adjusted in iterations until the analysis model 122 is able to correctly predict whether each magnetic field distribution corresponds to acceptable or unacceptable target trench data. In some embodiments, the analysis model 122 not only generates a classification, but also a predicted target profile including the locations and depths of the trenches. The training process can include comparing each predicted target profile to the actual product profile and adjusting the internal functions until the analysis model 122 can accurately predict the locations and depths of trenches in the target. Further details regarding the internal functions of the training process of the analysis model 122 in relation to FIGS. 9 and 10.

After the training process is complete, the analysis model 122 is implemented to determine, in situ, whether or not an acceptable target profile will result from a thin-film deposition process based on the current magnetic field distribution. In particular, during a thin-film deposition process, the magnetic sensor apparatus 105 senses the magnetic field and provides sensor signals to the control system 106. The control system 106 generates a magnetic field distribution and provides the magnetic field distribution to the analysis model 122. The analysis model 122 processes the magnetic field distribution and outputs a predicted target profile based on the magnetic field distribution. The analysis model 122 receives the magnetic field distribution and generates a classification or a predicted target profile based on the training process described above. Because the training process has trained the analysis model 122 to generate accurate target profiles or classifications based on the accumulated training data, the analysis model 122 can generate accurate target profiles or classifications for each new process based on the magnetic field distribution. Additionally, or alternatively, the analysis model 122 may output a prediction of whether or not an acceptable target profile will result based on the magnetic field distribution. Such a prediction may be a classification of the magnetic field distribution as abnormal/unacceptable or normal/acceptable. An abnormal or unacceptable magnetic field distribution simply corresponds to a magnetic field that will result in a distribution of trenches in the target 107 that results in a poorly or unacceptably formed thin-film. A normal or acceptable magnetic field distribution is a magnetic field distribution that will result in a distribution of trenches in the target 107 that results in a well-formed or acceptably formed thin-film based on thickness and uniformity of the thin-film.

In some embodiments, the control system 106 determines whether or not to stop a thin-film distribution process based on the output of the analysis model 122. In particular, the control system 106 can determine, during the thin-film deposition process, to stop a thin-film deposition process if the analysis model 122 indicates an abnormal or unacceptable target profile will result based on the magnetic field distribution. If the control system 106 stops the thin-film deposition process, then the control system 106 can indicate that maintenance, adjustment, or repairs are needed on the magnetron assembly 112 in order to generate a magnetic field that will result in an acceptable target profile.

Some embodiments, the thin-film deposition system 100 includes a motor coupled to the magnetron assembly 112. The motor causes the magnetron assembly 112 to rotate during the thin-film deposition process. In these cases, the magnetron sensor apparatus 105 may generate sensor signals throughout one or more rotations of the magnetron assembly 112. The control system 106 can generate a magnetic field distribution that indicates the average magnetic field strength or intensity during the rotations. In this case, the individual magnetic field strength or intensity values in the grid corresponding to the magnetic field distribution do not correspond to magnetic field strength or intensity values at a single moment, but rather each value in the grid corresponds to an average of the magnetic field strength or intensity at a particular location throughout one or more rotations of the magnetron assembly 112. Accordingly, the average magnetic field strength or intensity values are used to populate the magnetic field distribution. The control system 106 can utilize the analysis model 122 determine whether or not an acceptable target profile will result from the thin-film deposition process.

Figure 2:
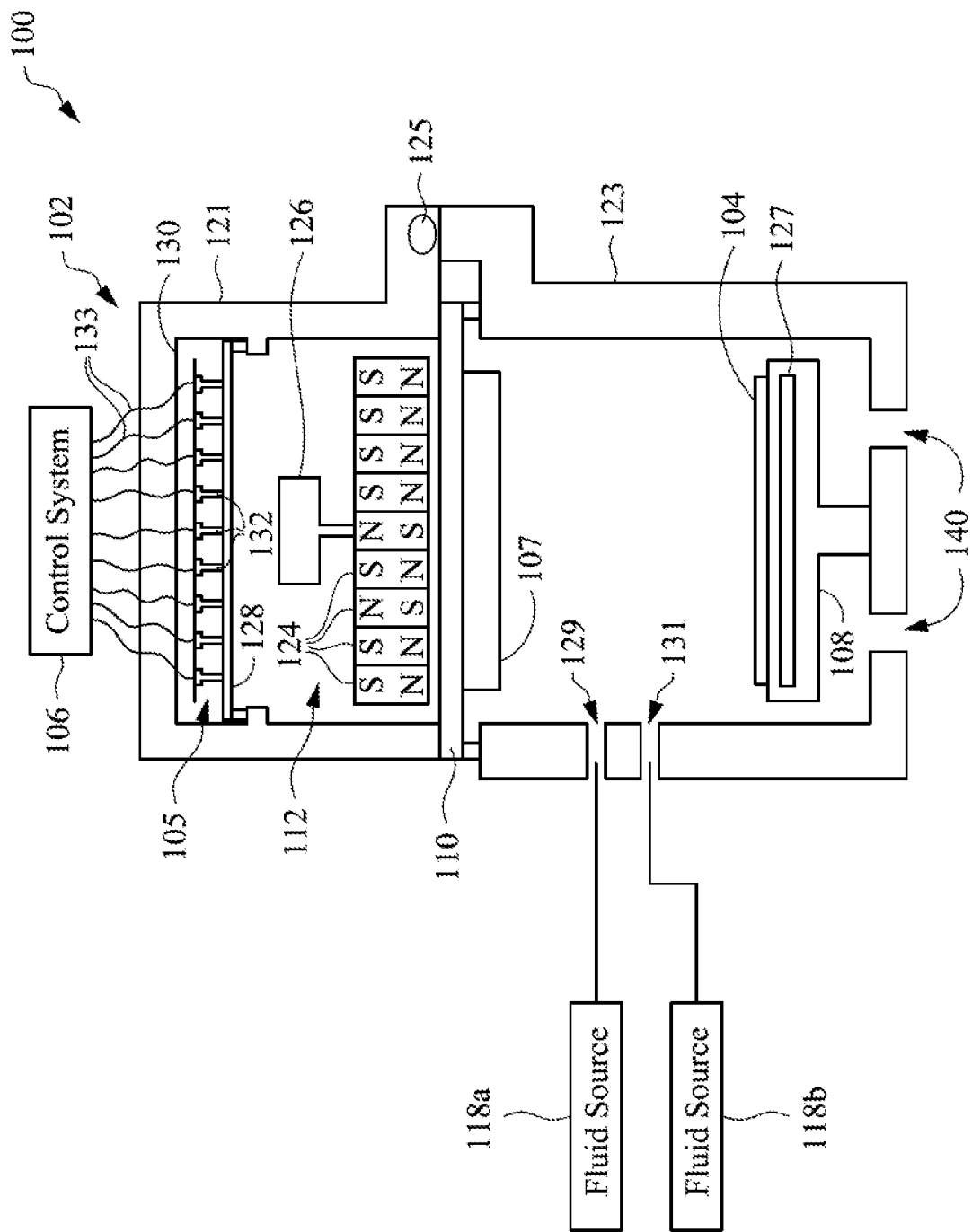
FIG. 2 is an illustration of a thin-film deposition system, in accordance with some embodiments.

FIG. 2 is an illustration of a thin-film deposition system 100, in accordance with some embodiments. The thin-film deposition system 100 of FIG. 2 is one example of the thin-film deposition system 100 of FIG. 1. The thin-film deposition system 100 includes a thin-film deposition chamber 102. The thin-film deposition chamber 102 includes an upper portion 121 and a lower portion 123. The upper portion 121 may opened by rotating around a hinge or joint 125. Alternatively, the upper portion 121 may be moved or removed relative to the lower portion 123 in other ways.

A wafer support 108 is positioned within the lower portion 123 of the thin-film deposition chamber 102. The wafer support 108 supports a wafer 104 during thin-film deposition processes. The wafer support 108 can include an internal heater 127. The heater 127 heats the wafer 104 during thin-film deposition processes. The heating of the wafer 104 can cause redistribution of material deposited during the thin-film deposition process in order to provide a more even distribution of deposition material. The wafer support 108 may also include an electrode or may act as an electrode in order to cooperate in generating electric fields within the thin-film deposition chamber 102. A power source 120 (see FIG. 1) can apply a voltage to the electrode of the wafer support 108. In some embodiments, the target support 110 and the wafer support 108 each include an electrode. By applying a voltage between the electrodes in the target support 110 and the wafer support 108, an electric field is generated. This electric field can assist in generating ions and charged particles and driving the ions and charged particles toward the target 107 in order to eject material from the target 107.

The thin-film deposition system 100 includes a target support 110 positioned at an interface between the upper portion 121 and the lower portion 123 of the thin-film deposition chamber 102. The target support 110 can be positioned in other locations or configurations within the thin-film deposition chamber 102 without departing from the scope of the present disclosure.

The target support 110 holds a target 107. The downward facing surface of the target 107 is exposed and faces the wafer 104. The target 107 includes a target material. During thin-film deposition processes, the target material is ejected and deposited on the surface of the wafer 104.

The thin-film deposition system includes a first fluid source 118*a* and a second fluid source 118*b*. The first fluid source 118*a* provides a first fluid into the thin-film deposition chamber 102 via an inlet 129. The second fluid source 118*b* provides a second fluid into the thin-film deposition chamber 102 via an inlet 131. In some embodiments, the target 107 is titanium and the thin-film to be deposited on the wafer 104 is titanium nitride. In this example, the first fluid may be argon and may be utilized to impact the target 107 in order to eject titanium from the target 107 toward the wafer 104. The second fluid may include nitrogen. The nitrogen interacts with the titanium to form the titanium nitride film on the surface of the wafer 104. Other fluids may be utilized for the fluid sources 118*a* and 118*b*. Furthermore, other target materials and thin-films may be utilized for the thin-film deposition processes without departing from the scope of the present disclosure.

The thin-film deposition system 102 includes a magnetron assembly 112. The magnetron assembly 112 includes an array of magnets 124. The magnets 124 are arrayed in a selected pattern or arrangement to produce a desired magnetic field. Each magnet 124 has a north pole and a south pole. For each magnet 124, a selected pole faces downward. The arrangement of the magnets 124 and the orientation of the poles are selected to produce a desired magnetic field shape below the target 107. The magnetic field interacts with ions and free electrons during thin-film deposition processes to promote impacts of the ions with the target 107 at selected locations. In some embodiments, a desired magnetic field shape can correspond to a magnetic field that will result in the trenches at desired locations in the target 107. As described previously, uniformity in thickness of the thin-film is based, in part, on the location of the trenches in the target 107. Carefully selecting the placement and strength of the magnets 124 can result in a desired overall magnetic field distribution below the target 107 that results in trenches forming in the target 107 at desired locations from impacts of ions and charged particles.

In some embodiments, the thin-film deposition system 102 includes a motor 126 coupled to the magnetron assembly 112. The motor 126 rotates the magnetron assembly 112 during thin-film deposition processes. The mother 126 may rotate the magnetron assembly 112 with a rotational speed between 30 RPM and 300 RPM. Rotational speeds below 30 RPM may not be sufficient to ensure a desired magnetic field intensity pattern about the target 107. Rotational speeds greater than 300 RPM may result in centripetal forces that cause too much of the ejected material to accumulate on the sidewalls of the thin-film deposition chamber 102 or at the peripheral regions of the wafer 104. Other rotational speeds can be utilized without departing from the scope of the present disclosure.

The thin-film deposition system 102 includes a magnetic sensor apparatus 105. The magnetic sensor apparatus 105 is positioned within the thin-film deposition chamber 102 above the magnetron assembly 112. The magnetic sensor apparatus 105 may include a baseplate 128 and a top plate 130. The support legs may extend from the bottom of the baseplate 128 to contact peripheral structures within the upper portion 121 of the thin-film deposition chamber 102.

The magnetic sensor apparatus 105 includes an array of magnetic sensors 132 positioned between the baseplate 128 and the top plate 130. The downward facing ends of the magnetic sensors 132 form an array in the horizontal plane. The magnetic sensors 132 can include magnetometers such as gauss meters or other types of magnetic sensors. Hall sensors, magnetoresistive sensors, or other types of magnetometers.

Each magnetic sensor 132 senses the magnetic field at its particular position. The magnetic field values from each of the magnetic sensors 132 collectively indicate a magnetic field distribution within the thin-film deposition chamber 102. Although the magnetic sensors 132 are described as measuring magnetic fields, the magnetic sensors 132 can measure magnetic field strength, magnetic field intensity, or magnetic flux density.

A respective wire 133 is coupled to each magnetic sensor 132. Each wire 132 carries magnetic sensor signals to the control system 106. The control system 106 generates a magnetic field distribution or mapping based on the sensor signals provided by each of the individual sensors. The magnetic field distribution indicates the magnetic field strength or intensity at each of the locations of the magnetic sensors. The magnetic field distribution is based on the placement and strength of each of the magnets of the magnetron assembly 112. In some embodiments, a separate sensor system may receive the sensor signals via the wires 133 and may then provide sensor values to the control system 106. Such a separate sensor system may also be part of the control system 106.

Each magnet 124 generates its own magnetic field. The strength of the magnetic field at any given location within the thin-film deposition chamber is the sum of the magnetic fields from each of the magnets 124 at that location. Each magnetic sensor 132 senses the strength of the magnet field at its particular location. Each magnetic sensor 132 generates sensor signals indicative of the magnetic field strength. The magnetic sensors 132 may be arrayed in a horizontal plane above the magnetron assembly.

The control system 106 receives the sensor signals from each of the magnetic sensors 132. The control system 106 generates the magnetic field distribution based on the sensor signals. For example, the control system 106 knows the position of each magnetic sensor within the array. The magnetic field distribution may correspond to a grid of magnet field strength values. Each location on the grid corresponds to a position of one of the magnetic sensors within the array. Accordingly, the magnetic field distribution may correspond to the strength of the magnetic field at each of a plurality of locations corresponding to locations of the magnetic sensors.

The bottom portion 123 of the thin-film deposition chamber 102 includes exhaust outlets 140. Prior to a thin-film deposition process, vacuum conditions may be established within the interior volume of the thin-film deposition chamber 102 by pumping air and other fluids out of the interior volume of the thin-film deposition chamber 102 via the exhaust outlets 140. After a thin-film deposition process, remaining fluids and byproducts may be pumped out of the interior volume of the thin-film deposition chamber via the exhaust outlets 140.

Figure 3:
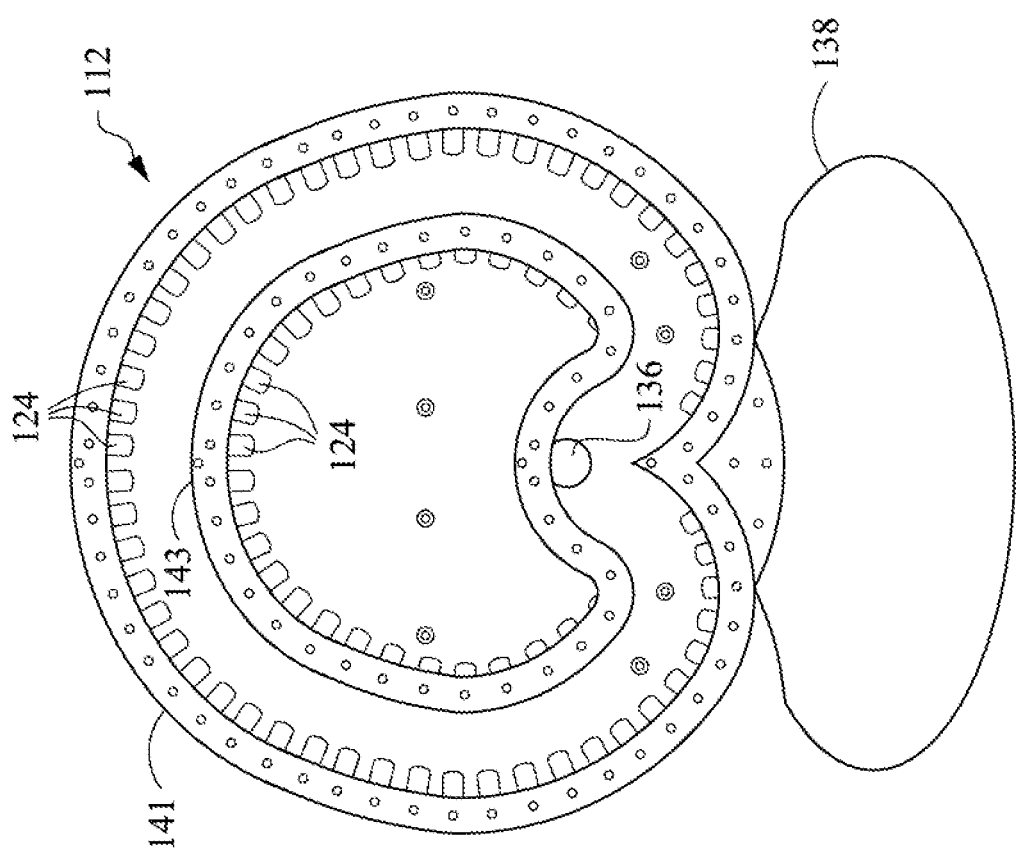
FIG. 3 is a top view of a magnetron assembly of a thin film deposition system, in accordance with some embodiments.

FIG. 3 is a top view of a magnetron assembly 112, in accordance with some embodiments. The magnetron assembly 112 of FIG. 3 is one example of a magnetron assembly of FIGS. 1 and 2. The magnetron assembly 112 includes a plurality of magnets 124 arranged in an outer track 141 and an inner track 143. Magnets can be individually replaced or flipped to adjust the magnetic field distribution in the event that an abnormal or unacceptable magnetic field distribution is detected.

The magnetron assembly 112 also includes an axle slot 136 by which an axle can be coupled between the motor 126 and the magnetron assembly 112 in order to rotate the magnetron assembly 112 during thin-film deposition processes. The magnetron assembly 112 also includes a counter weight 138. The counterweight 138 may also be a magnet. Other types of magnetron assemblies and other configurations of magnetron assemblies can be utilized without departing from the scope of the present disclosure. The counterweight 138 can serve to add stability to the magnetron assembly 112 in embodiments in which the magnetron assembly 112 rotates during thin-film deposition processes. In the absence of the counterweight 138, rotation of the magnetron assembly 112 could result in wobbling of the thin-film deposition system during thin-film deposition processes. The counterweight 138 may be utilized to ensure that there is not undesired wobbling or jostling of the thin-film deposition system 100 during thin-film deposition processes.

Figure 4:
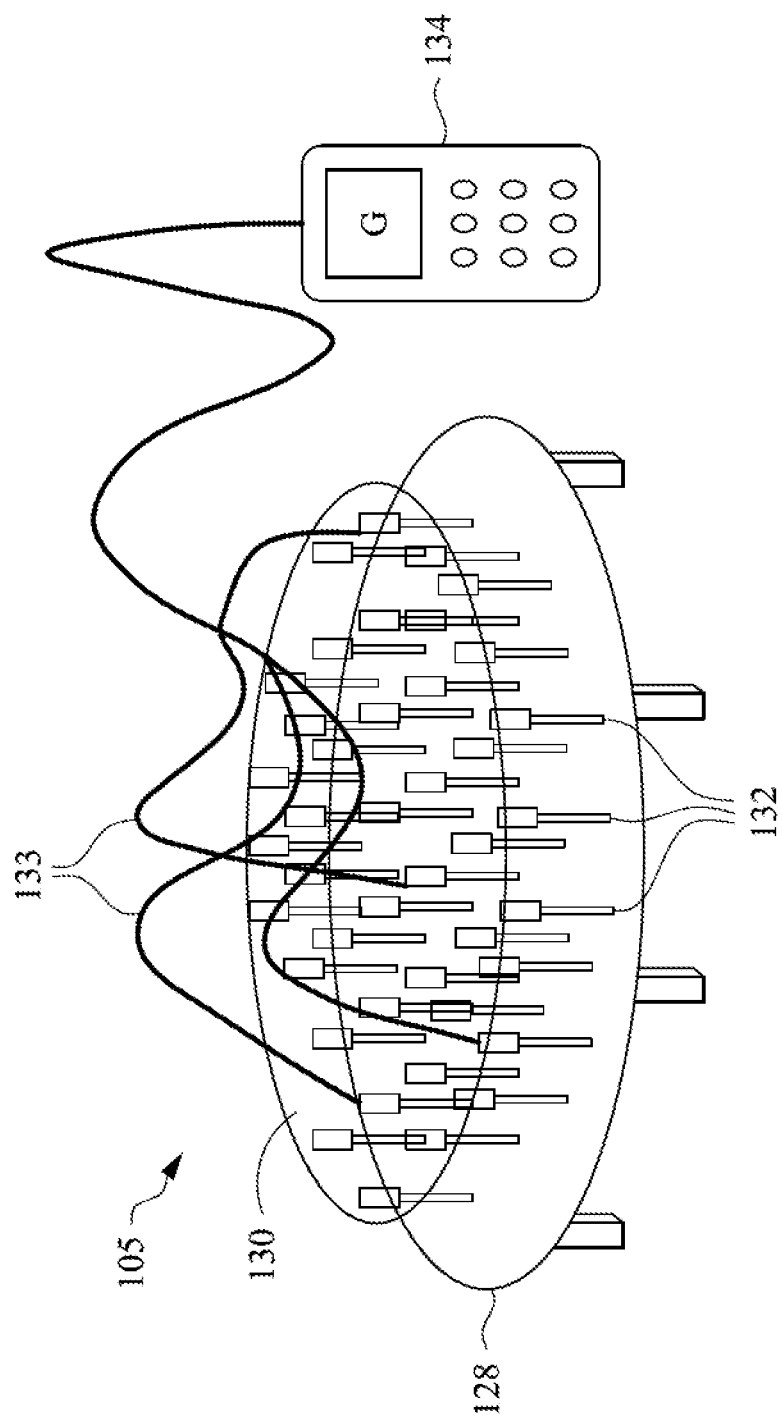
FIG. 4 is an illustration of a magnetic sensor apparatus, in accordance with some embodiments.

FIG. 4 is an illustration of a magnetic sensor apparatus 105, in accordance with some embodiments. The magnetic sensor apparatus 105 of FIG. 4 is one example of a magnetic sensor apparatus 105 of FIGS. 1 and 2. The magnetic sensor apparatus 105 includes a circular baseplate 128 having a diameter between 320 mm and 380 mm. The baseplate 128 can be made of plastic material, a ceramic material or other types of material. Other shapes, dimensions, and materials can be utilized for the baseplate 128 without departing from the scope of the present disclosure.

The magnetic sensor apparatus 105 includes a circular top plate 130. The top plate 130 can have a diameter between 280 mm and 320 mm. The top plate 130 can include a plastic material, a ceramic material, or other materials. Other shapes, dimensions, and materials can be utilized for the top plate 130 without departing from the scope of the present disclosure.

The magnetic sensor apparatus includes a plurality of magnetic sensors 132 positioned between the baseplate 128 and the top plate 130. The magnetic sensors 132 can include magnetometers or other types of sensors that can sense magnetic fields or associated parameters. The sensitive end of each magnetic sensor 132 is coupled to the baseplate 128. Wires 133 couple the magnetic sensors 132 to a sensor system 134. As described previously, the wires 132 may be coupled directly to a control system 106, or, alternatively, the sensor system 134 may be part of the control system 106. The vertical length of the magnetic sensors 132 may be between 2 cm and 5 cm. Accordingly, the baseplate 128 and the top plate 130 may be separated by distance between 2 cm and 5 cm. Other types of magnetic sensors 132, other positions, and other dimensions can be utilized without departing from the scope of the present disclosure.

Figure 5:
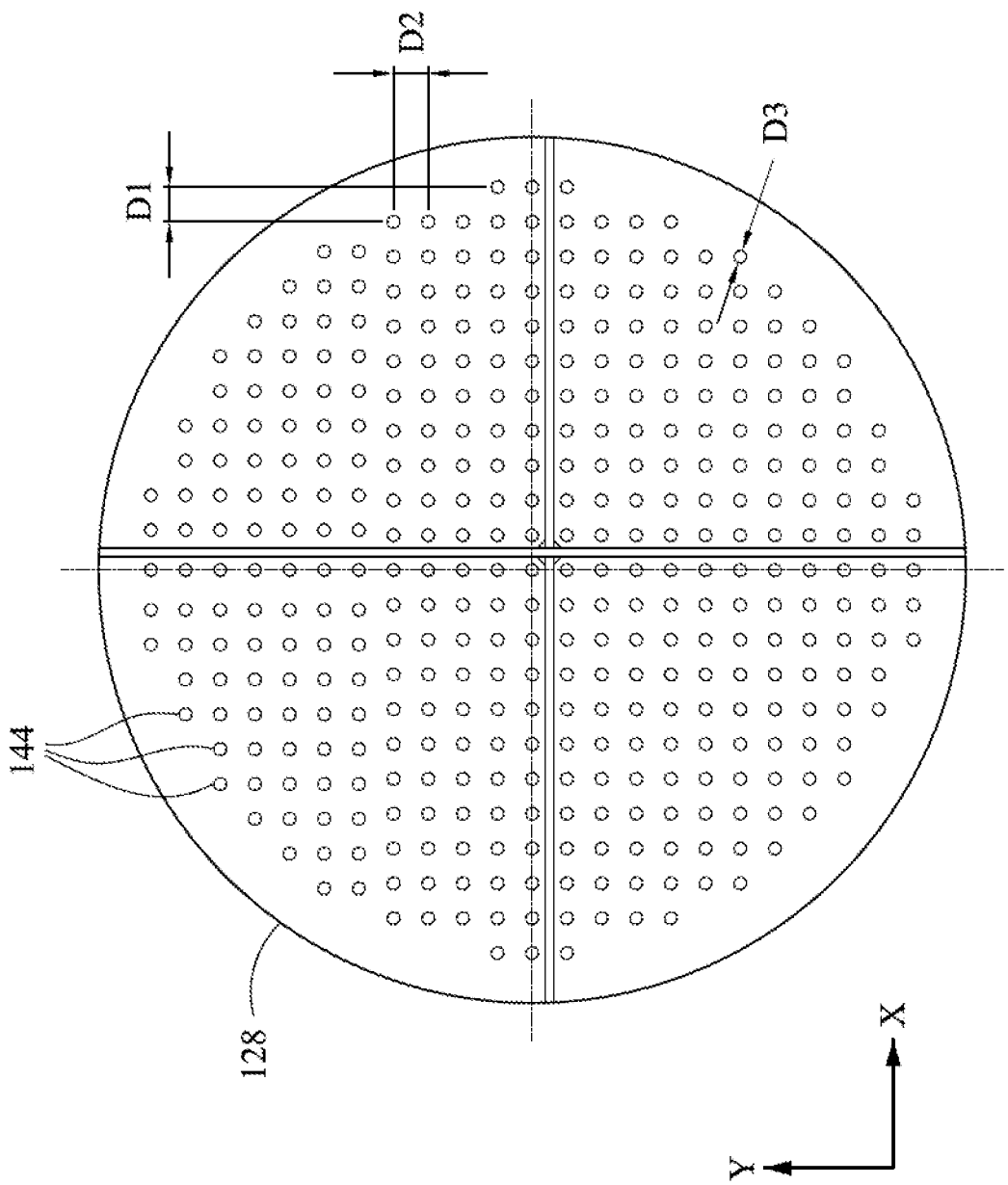
FIG. 5 is a top view of a baseplate of a magnetic sensor apparatus, in accordance with some embodiments.

FIG. 5 is a top view of the baseplate 128 of a magnetic sensor apparatus 105, in accordance with some embodiments. The top view illustrates X and Y coordinates corresponding to the horizontal plane. The baseplate 128 includes sensor locations 144. The sensor locations 144 can include apertures or indentations that receive the sensing tips of the magnetic sensors 132. The sensor locations 144 can also include areas having a different material than the other regions of the baseplate 128. The different material can facilitate proper sensing of magnetic fields. The sensing locations can be separated from each in the X direction by a dimension D1. The dimension D1 can be between 10 mm and 30 mm. The sensing locations 144 are separated from each other in the Y direction by a dimension D2. The dimension D2 can be between 10 mm and 30 mm. The sensing locations 144 can have a width or diameter of dimension D3. The dimension D3 can be between 1 mm and 10 mm. Other dimensions, materials, and layouts can be utilized for the baseplate 128 without departing from the scope of the present disclosure.

Figure 6:
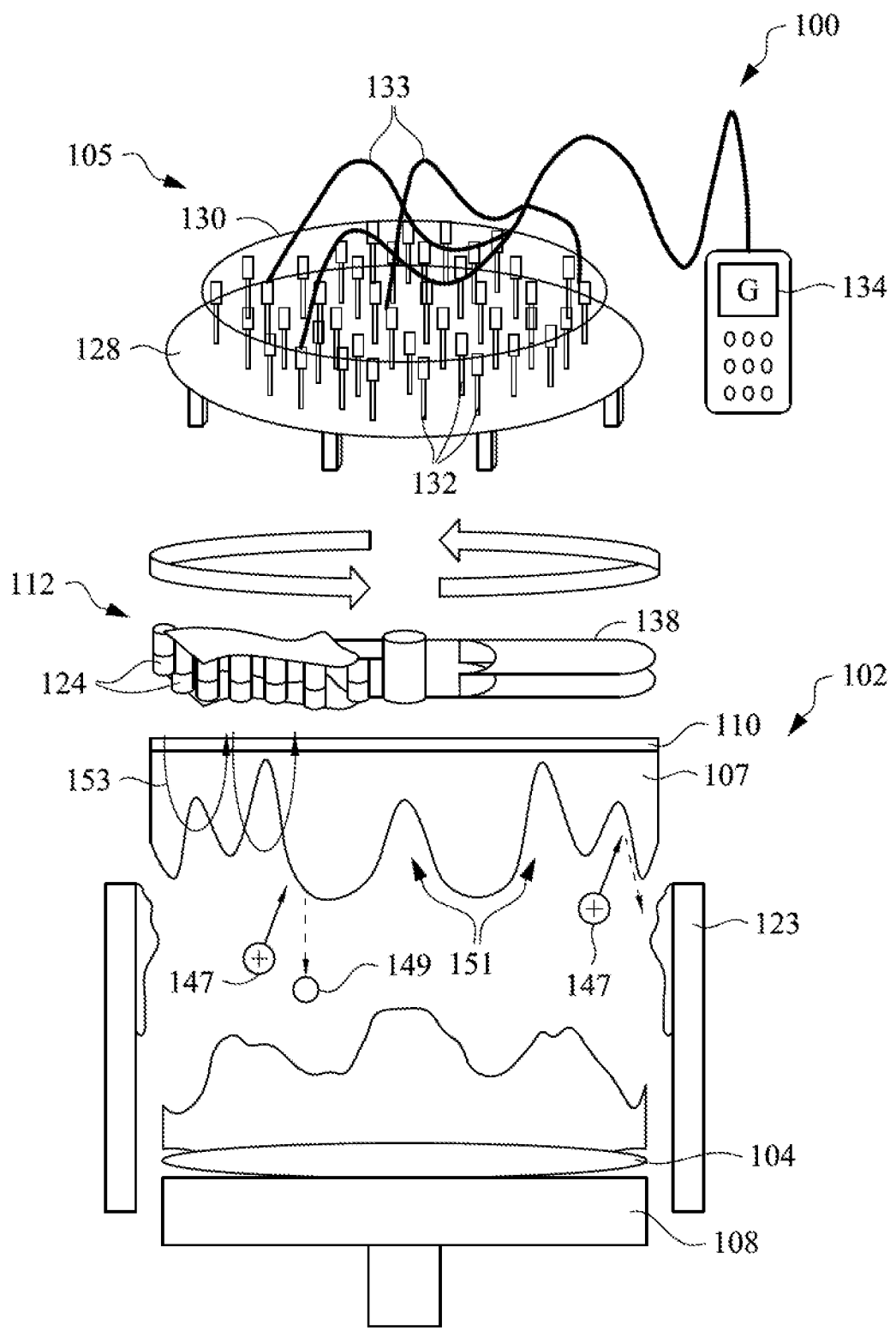
FIG. 6 is an illustration of a thin-film deposition system, in accordance with some embodiments.

FIG. 6 is a simplified illustration of a portion of a thin-film deposition system 100 during operation of the thin-film deposition system 100, in accordance with some embodiments. A target support 110 supports a target 107. A magnetron assembly 112 rotates above the target support. A wafer 104 is supported on a wafer support 108. A magnetic sensor apparatus 105 is positioned above the magnetron assembly 112.

Atoms 147 are introduced into the thin-film deposition chamber from a fluid source 118a (see FIG. 2). The atoms 147 become ionized and by application of a voltage as described previously. A magnetic field, illustrated by field lines 153 is generated in the vicinity of the target 107 by the magnetron assembly 112. The voltage applied to the target 110 causes the positively charged atoms 147 to impact the target 107. When the positively charged atoms 147 impact the target 107, target material 149 is ejected from the target 107. They ejected target material 149 accumulates on the wafer 104 to form a thin-film 150. In practice, both the target 107 and the thin-film 150 are much thinner than illustrated in FIG. 6. Some of the ejected target material 149 also accumulates on the sidewalls of the lower portion 123 of the thin-film deposition chamber 102.

As described previously, the magnetic field generated by the magnetron assembly 112 causes the ionized atoms 147 to impact the target 107 more frequently at particular locations based on the shape of the magnetic field, as indicated by the field lines 153. The result is that the valleys 151 are formed in the target 107. The valleys 151 correspond to locations at which the ionized atoms 147 impact the target 107 those frequently. The overall result is a target profile of the target 107. The target profile corresponds to the distribution of peaks and valleys, and the relative height/depths in the target 107.

The placement and depth of the valleys 151 can play a role in proper formation of the thin-film 150. If the placement and depth of the valleys 151 does not occur in a desirable manner, it is possible that the thin-film 150 will not be properly formed. As a target profile is based, in part, on the magnetic field, abnormalities in the magnetic field can be indicative or predictive of undesirable target profiles and corresponding improper formation of the thin-films 150. As described above, the placement of trenches within the target 107 can affect the uniformity in thickness of the thin-film on the wafer 104. If the trenches do not occur in positions that will result in a desired thin-film characteristics, then the trenches do not occur at undesirable locations. Furthermore, if the trenches are not sufficiently deep, this may be an indication that impact of the ions and charged particles is not sufficiently localized but is spread out over in undesirably large area of the target 107. This can also result in undesirable thin-film characteristics.

The magnetic sensor apparatus 105 senses the magnetic field. In particular, the magnetic sensors 132 each sense the magnetic field at the corresponding locations. The sensor system 134, or the control system 106, generates a magnetic field distribution corresponding to a mapping of the magnetic field strength or intensity at the various locations of the magnetic sensors 132. The analysis model 122 of the control system 106 analyzes the magnetic field distribution. The analysis model 122 can determine whether or not the magnetic field distribution will result in an undesirable target profile. In some cases, the analysis model 122 can predict an entire target profile based on the magnetic field distribution. The control system 106 can determine whether or not the thin-film deposition process should be stopped based on the magnetic field distribution.

The magnetic sensor apparatus 105 can rapidly sense the magnetic field in situ during a thin-film deposition process. In some embodiments, the magnetic sensor apparatus 105 can provide the magnetic sensor signals for a magnetic field distribution between 0.1 and 0.3 seconds during a thin-film deposition process. The analysis model 122 can then analyze the magnetic field distribution and can indicate whether or not the thin-film deposition process should be stopped in order to adjust the magnetron assembly 112. The control system 106 may stop the thin-film deposition process when the analysis model 122 and unacceptable trench distribution based on the magnetic field distribution. As described previously, and unacceptable trench distribution may result in a thin-film having undesirable qualities. Thus, the control system 106 may stop the thin-film deposition process in response to the analysis model 122 predicting that the magnetic field distribution corresponds to an undesirable trench distribution. Accordingly, the combination of the magnetic sensor apparatus 105 and the analysis model 122 can rapidly detect magnetic field abnormalities and can stop a thin-film deposition process very rapidly during a thin-film deposition process. Other processes and feedback times can be utilized without departing from the scope of the present disclosure.

Figure 7A:
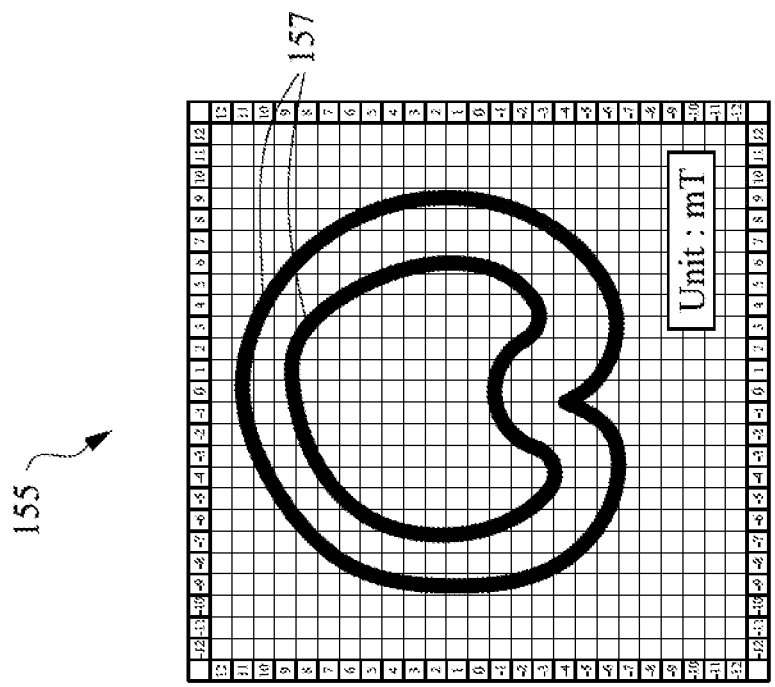
FIGS. 7A and 7B are representations of magnetic field distributions, in accordance with some embodiments.

FIG. 7A is a magnetic field distribution 155, in accordance with some embodiments. The magnetic field distribution includes, for each magnetic sensor 132 of the magnetic sensor apparatus 105, a magnetic field value. In the example of FIG. 7A, the magnetic field values are given in units of mT (miliTeslas). The example of FIG. 7A includes color coding to illustrate areas of high magnetic field strength. Larger numbers, either positive or negative, correspond to higher magnetic field strength. Color coding may be utilized such that darker shades of red indicate higher positive (north) magnetic field strength values, while darker shades of blue may indicate higher negative (south) magnetic field strength values. Other types of magnetic field distributions 155 can be utilized without departing from the scope of the present disclosure.

Figure 7B:
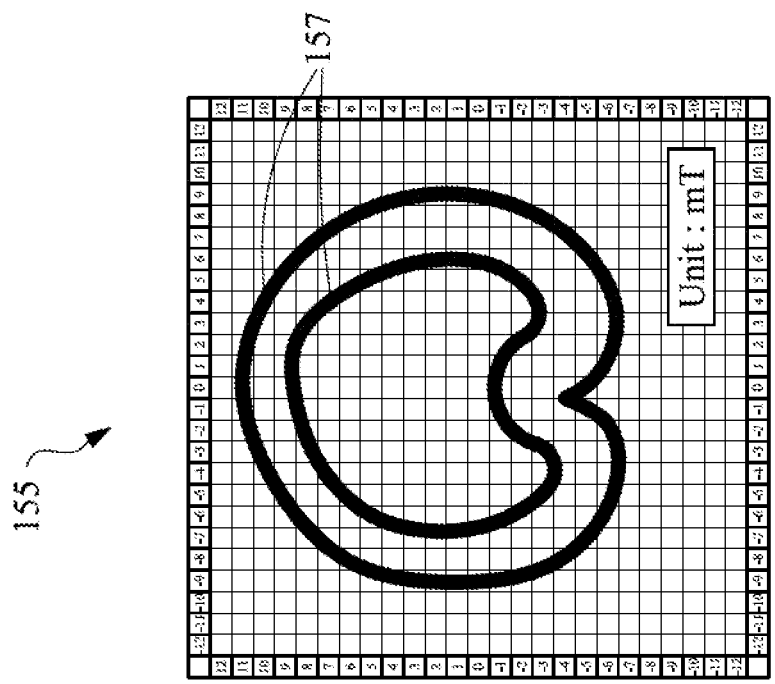

FIG. 7B is a magnetic field distribution 155, in accordance with some embodiments. The magnetic field distribution 155 of FIG. 7B corresponds to the magnetic field distribution 155 of FIG. 1, but with markings 157 indicating locations of magnetic field intensity peaks. Various schemes can be utilized for magnetic field distributions 155 without departing from the scope of the present disclosure. While FIGS. 7A and 7B illustrate magnetic field distributions 155 and format that is viewable an understandable for humans, in practice, the magnetic field distributions 155 may corresponds to vectors or matrices with magnetic field values that can be quickly and readily processed by the analysis model 122.

Figure 8C:
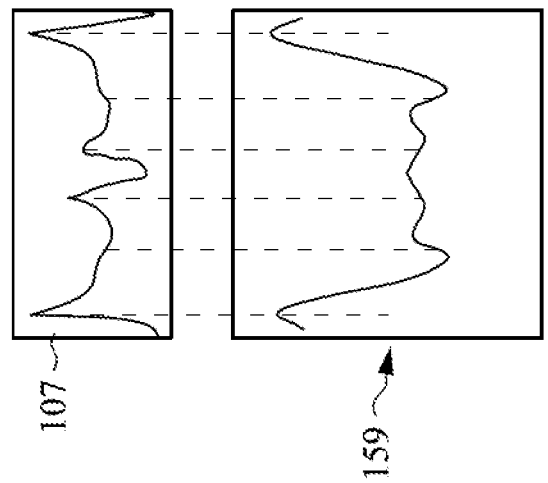
FIGS. 8A-8C are representations of sputtering targets and corresponding graphs, in accordance with some embodiments.
Figure 8B:
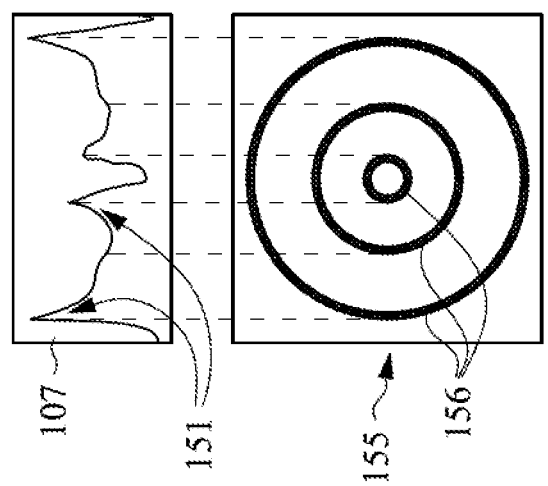
Figure 8A:
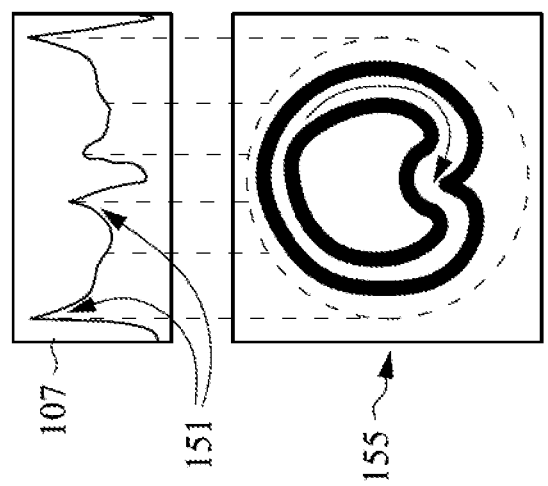

FIG. 8A illustrates a magnetic field distribution 155 mapped to the location of valleys 151 and the target 107. The magnetic field distribution 155 of FIG. 8A corresponds to an instantaneous magnetic field distribution taken at a particular rotational position of the magnetron 112.

FIG. 8B illustrates a magnetic field distribution 155, in accordance with some embodiments. The magnetic field distribution 155 of FIG. 8B can be generated by summing, averaging, or otherwise aggregating several instantaneous magnetic field distributions 155 throughout one or more rotations of the magnetron assembly 112. Such an aggregation results in intensity lines 156 indicating locations of peaks magnetic field intensity during a rotation of the magnetron assembly 112. The intensity lines 106 generally align with valleys 151 within the target 107. Accordingly, such aggregation of magnetic field distributions 155 can predict the location of valleys 151 and the overall target profile of a target 107.

FIG. 8C is a target erosion graph 159, in accordance with some embodiments. The target erosion graph indicates a distribution of target erosion for target 107 based on the aggregated magnetic field distribution 155 of FIG. 8B. The analysis model can generate or analyze such a target erosion graph 159 in order to generate an output indicating whether or not a thin-film deposition process should be stopped.

Figure 9:
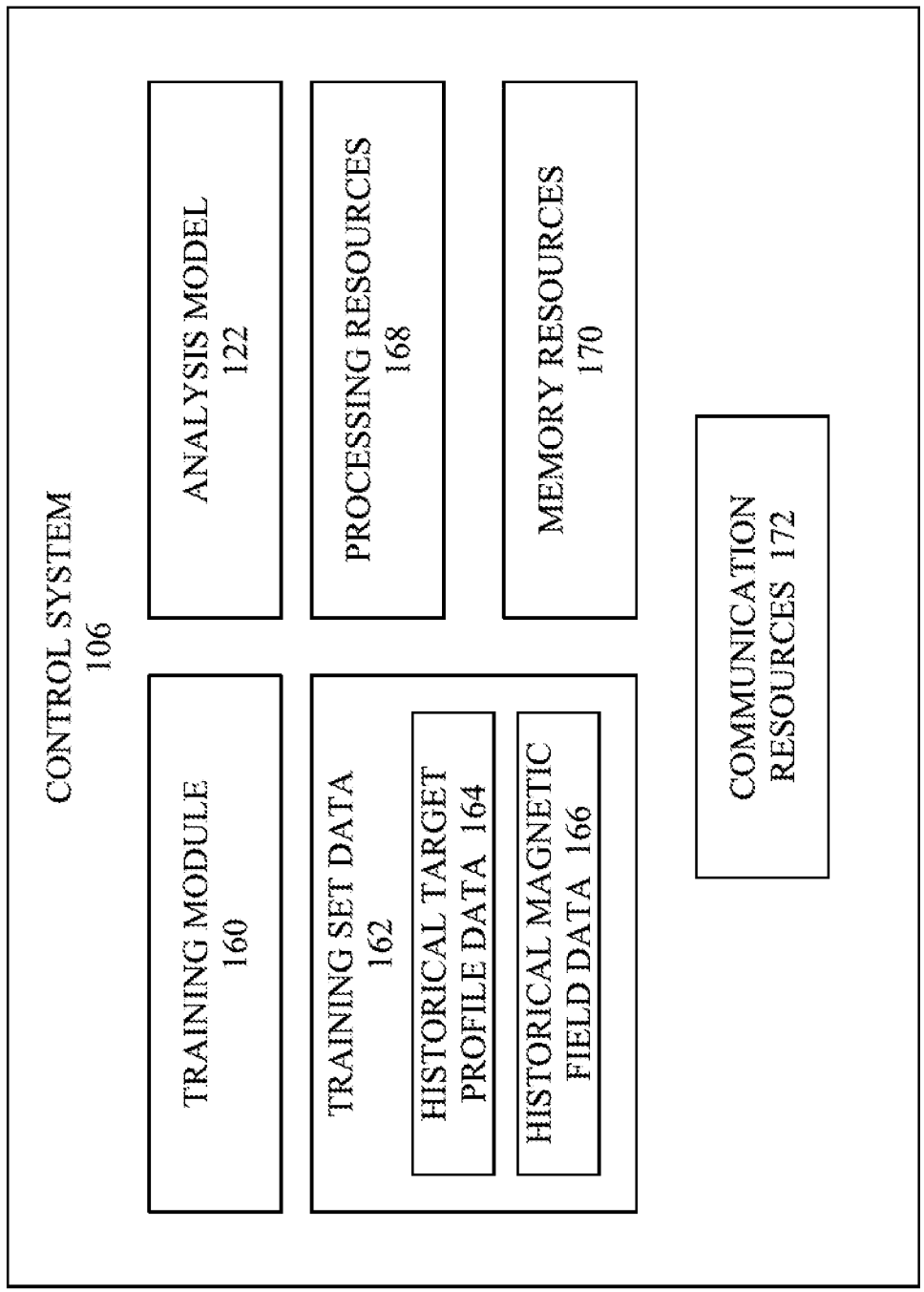
FIG. 9 is a block diagram of a control system 106, in accordance with some embodiments.

FIG. 9 is a block diagram of the control system 106, according to one embodiment. The control system 106 of FIG. 9 is configured to control operation of a thin-film deposition system 100, according to one embodiment. The control system 106 is one example of a control system 106 of FIGS. 1 and 2. The control system 106 utilizes machine learning to detect magnetic field distributions that will result in undesirable profiles in a target material.

In one embodiment, the control system 106 includes an analysis model 122 and a training module 160. The training module trains the analysis model 122 with a machine learning process. The machine learning process trains the analysis model 122 to determine whether a magnetic field distribution within a deposition chamber will result in an undesirable target profile. Although the training module 160 is shown as being separate from the analysis model 122, in practice, the training module 160 may be part of the analysis model 122.

The control system 106 includes, or stores, training set data 162. The training set data 162 includes historical target profile data 164 and historical magnetic field data 166. The historical target profile data 164 includes data related to target profiles resulting from previous thin-film deposition processes. The historical magnetic field data 166 includes data related to magnetic field distributions during the thin-film deposition processes that generated the thin-films. As will be set forth in more detail below, the training module 160 utilizes the historical target profile data 164 and the historical magnetic field data 166 to train the analysis model 122 with a machine learning process.

In one embodiment, the historical target profile data 164 includes data related to the profile of target materials after previously performed thin-film deposition processes. For example, during operation of a semiconductor fabrication facility, thousands or millions of semiconductor wafers may be processed over the course of several months or years, with a correspondingly large number of thin-film deposition processes being performed. After each thin-film deposition process, the profiles of the target materials are measured as part of a quality control process. The historical target profile data 164 includes the locations of peaks and valleys in the target materials, and the depths of the valleys. Accordingly, the historical target profile data 164 can include profile data for a large number of targets used in thin-film deposition processes.

In one embodiment, the historical target profile data 164 may also include data related to the thickness of thin-films at intermediate stages of the thin-film deposition processes.

In one embodiment, the historical magnetic field distributions 166 include various magnetic field distributions or parameters during thin-film deposition processes that produce the target profiles associated with the historical target profile data 164. Accordingly, for each target having data in the historical target profile data 164, the historical magnetic field data 166 can include the magnetic field distributions that were present during deposition of the thin-films. For example, the historical magnetic field data 166 can include data related to the magnetic field strength or intensity at a plurality of locations within a deposition chamber.

In one embodiment, the training set data 162 links the historical target profile data 164 with the historical magnetic field data 166. In other words, the target profile associated with a particular deposition process is linked to the magnetic field data associated with that deposition process. Furthermore, each target profile in the historical target profile data can be labeled as proper or abnormal. As will be set forth in more detail below, the labeled training set data can be utilized in a machine learning process to train the analysis model 122 to predict whether a given magnetic field distribution will result in a proper or abnormal target profile.

In one embodiment the analysis model 122 includes a neural network. Training of the analysis model 122 will be described in relation to a neural network. However, other types of analysis models or algorithms can be used without departing from the scope of the present disclosure. The training module 160 utilizes the training set data 162 to train the neural network with a machine learning process. During the training process, the neural network receives, as input, historical magnetic field data 166 from the training set data. During the training process, the neural network outputs predicted target profile data. The predicted target profile data predicts the target profile that would result from the historical magnetic field data. The training process trains the neural network to generate predicted target profile data. The predicted target profile data can include locations and depths of peaks and valleys in the target material, or other characteristics.

In one embodiment, the neural network includes a plurality of neural layers. The various neural layers include neurons that define one or more internal functions. The internal functions are based on weighting values associated with neurons of each neural layer of the neural network. During training, the control system 106 compares, for each set of historical magnetic field data, the predicted target profile data to the actual historical target profile data associated with that historical magnetic field distribution. The control system generates an error function indicating how closely the predicted target profile data matches the historical target profile data. The control system 106 then adjusts the internal functions of the neural network. Because the neural network generates predicted target profile data based on the internal functions, adjusting the internal functions will result in the generation of different predicted target profile data for a same set of historical magnetic field data. Adjusting the internal functions can result in predicted target profile data that produces larger error functions (worse matching to the historical target profile data 164) or smaller error functions (better matching to the historical target profile data 164).

After adjusting the internal functions of the neural network, the historical magnetic field data 166 is again passed to the neural network and the analysis model 122 again generates predicted thin-films data. The training module 160 again compares the predicted target profile data to the historical target profile data 164. The training module 160 again adjusts the internal functions of the neural network. This process is repeated in a very large number of iterations of monitoring the error functions and adjusting the internal functions of the neural network until a set of internal functions is found that results in predicted target profile data that matches the historical target profile data 164 across the entire training set.

At the beginning of the training process, the predicted target profile data likely will not match the historical target profile data 164 very closely. However, as the training process proceeds through many iterations of adjusting the internal functions of the neural network, the errors functions will trend smaller and smaller until a set of internal functions is found that results in predicted target profile data that match the historical target profile data 164. Identification of a set of internal functions that results in predicted target profile data that matches the historical target profile data 164 corresponds to completion of the training process. Once the training process is complete, the neural network is ready to predict target profiles based on magnetic field distributions.

In some embodiments, the training process trains the analysis model to predict whether a magnetic field distribution will result in an abnormal or acceptable target profile. In this case, each historical target profile in the historical target profile data 164 is labeled as either abnormal or acceptable. The training process trains the analysis model 122 to correctly determine whether each historical magnetic field distribution resulted in an acceptable or abnormal target profile. After the training process, the analysis model 122 can be utilized to predict whether the magnetic field distribution will result in an abnormal or acceptable target profile.

In one embodiment, because the analysis model 122 has been trained with a machine learning process that trains the analysis model 122 to generate predicted target data based on magnetic field data, the analysis model 122 is able to identify whether the current magnetic field distribution will result in a desirable target profile or abnormal target profile. The analysis model 122 can output predicted target profile data in situ during a thin-film deposition process. Additionally, or alternatively, the analysis model 122 can output a prediction indicating whether an abnormal or desirable target profile will result from a current magnetic field distribution. The control system 106 can utilize this data to stop a thin-film deposition system if the analysis model 122 indicates that the current magnetic field distribution will result in an undesirable target profile.

In one embodiment, the control system 106 includes processing resources 168, memory resources 170, and communication resources 172. The processing resources 168 can include one or more controllers or processors. The processing resources 168 are configured to execute software instructions, process data, make thin-film deposition control decisions, perform signal processing, read data from memory, write data to memory, and to perform other processing operations. The processing resources 168 can include physical processing resources 168 located at a site or facility of the thin-film deposition system 100. The processing resources can include virtual processing resources 168 remote from the site thin-film deposition system 100 or a facility at which the thin-film deposition system 100 is located. The processing resources 168 can include cloud-based processing resources including processors and servers accessed via one or more cloud computing platforms.

In one embodiment, the memory resources 170 can include one or more computer readable memories. The memory resources 170 are configured to store software instructions associated with the function of the control system and its components, including, but not limited to, the analysis model 122. The memory resources 170 can store data associated with the function of the control system 106 and its components. The data can include the training set data 162, current magnetic field data, and any other data associated with the operation of the control system 106 or any of its components. The memory resources 170 can include physical memory resources located at the site or facility of the thin-film deposition system 100. The memory resources can include virtual memory resources located remotely from site or facility of the thin-film deposition system 100. The memory resources 170 can include cloud-based memory resources accessed via one or more cloud computing platforms.

In one embodiment, the communication resources can include resources that enable the control system 106 to communicate with equipment associated with the thin-film deposition system 100. For example, the communication resources 172 can include wired and wireless communication resources that enable the control system 106 to receive the sensor data associated with the thin-film deposition system 100 and to control equipment of the thin-film deposition system 100. The communication resources 172 can enable the control system 106 to communicate with remote systems. The communication resources 172 can include, or can facilitate communication via, one or more networks such as wire networks, wireless networks, the Internet, or an intranet. The communication resources 172 can enable components of the control system 106 to communicate with each other.

In one embodiment, the analysis model 122 is implemented via the processing resources 168, the memory resources 170, and the communication resources 172. The control system 106 can be a dispersed control system with components and resources and locations remote from each other and from the thin-film deposition system 100.

Figure 10:
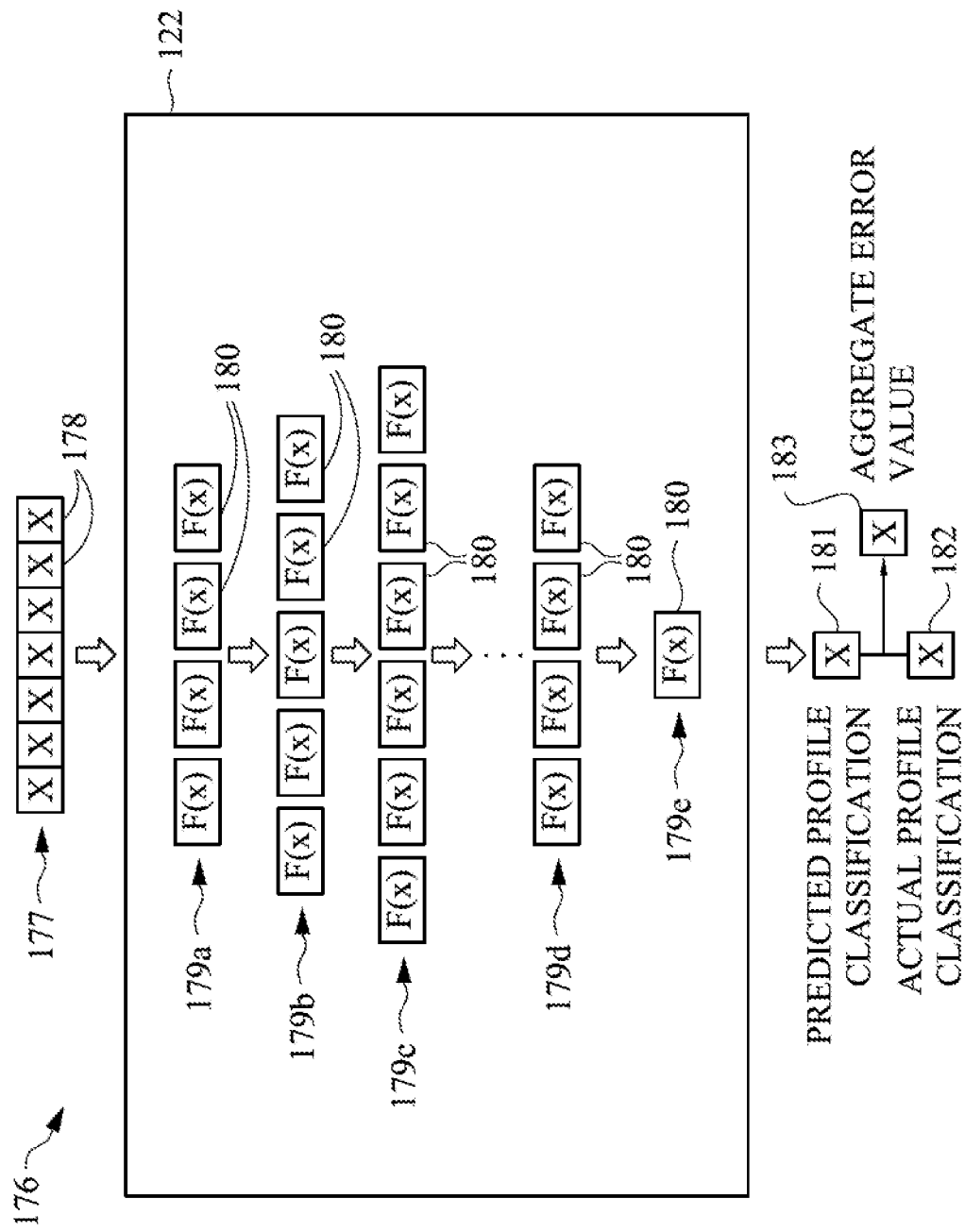
FIG. 10 is a block diagram of a neural network of an analysis model, in accordance with some embodiments.

FIG. 10 is a block diagram 176 illustrating operational aspects and training aspects of analysis model 122, according to one embodiment. As described previously, the training set data 162 includes data related to a plurality of previously performed thin-film deposition processes. Each previously performed thin-film deposition process took place with particular magnetic field distributions and resulted in a thin-film having particular characteristics. The magnetic field distributions for each previously performed thin-film deposition process are formatted into a respective magnetic field vector 177. The magnetic field vector includes a plurality of data fields 178. Each data field 178 corresponds to a magnetic field strength or intensity in a particular location within a thin-film deposition chamber, or from a particular magnetic sensor of a magnetic sensor apparatus.

The example of FIG. 10 illustrates a single magnetic field vector 177 that will be passed to the analysis model 122 during the training process. In the example of FIG. 10, the magnetic field vector 177 includes nine data fields 178. In practice, each magnetic field vector 177 can include more or fewer data fields than are shown in FIG. 10 without departing from the scope of the present disclosure. Each magnetic field vector 177 can include different types of magnetic field distributions without departing from the scope of the present disclosure. The particular magnetic field distributions illustrated in FIG. 10 are given only by way of example. Each magnetic field or intensity value is represented by a numerical value in the corresponding data field 178.

The analysis model 122 includes a plurality of neural layers 179a-e. Each neural layer includes a plurality of nodes 180. Each node 180 can also be called a neuron. Each node 180 from the first neural layer 179a receives the data values for each data field from the magnetic field vector 177. Each neuron 180 includes a respective internal mathematical function labeled F(x) in FIG. 10. Each node 180 of the first neural layer 179a generates a scalar value by applying the internal mathematical function F(x) to the data values from the data fields 178 of the magnetic field vector 177. Further details regarding the internal mathematical functions F(x) are provided below.

Each node 180 of the second neural layer 179b receives the scalar values generated by each node 180 of the first neural layer 179a. Accordingly, in the example of FIG. 10 each node of the second neural layer 179b receives four scalar values because there are four nodes 180 in the first neural layer 179a. Each node 180 of the second neural layer 179b generates a scalar value by applying the respective internal mathematical function F(x) to the scalar values from the first neural layer 179a.

Each node 180 of the third neural layer 179c receives the scalar values generated by each node 180 of the second neural layer 179b. Accordingly, in the example of FIG. 10 each node of the third neural layer 179c receives five scalar values because there are five nodes 180 in the second neural layer 179b. Each node 180 of the third neural layer 179c generates a scalar value by applying the respective internal mathematical function F(x) to the scalar values from the nodes 180 of the second neural layer 179b.

Each node 180 of the neural layer 179d receives the scalar values generated by each node 180 of the previous neural layer (not shown). Each node 180 of the neural layer 179d generates a scalar value by applying the respective internal mathematical function F(x) to the scalar values from the nodes 180 of the second neural layer 179b.

In the example of FIG. 10, the final neural layer includes only a single node 180. The final neural layer receives the scalar values generated by each node 180 of the previous neural layer 179d. The node 180 of the final neural layer 179e generates a data value 181 by applying a mathematical function F(x) to the scalar values received from the nodes 180 of the neural layer 179d.

In the example of FIG. 10, the data value 181 corresponds to a prediction of an acceptable or unacceptable target profile resulting from the magnetic field vector 177. In other embodiments, the final neural layer 179e may generate multiple data values that collectively correspond to a prediction of a target profile resulting from the magnetic field vector 177. Accordingly, the structure of the neural network is based on the desired prediction. A simple prediction of acceptable or unacceptable target profile may correspond to a single data value 181. A prediction of an entire target profile may correspond to a large number of data values 181 for a given magnetic field vector 177. In some cases, the output of the neural network may be both a complete predicted target profile and a prediction of acceptable or unacceptable.

Continuing with an example in which the output of the neural network is a simple classification, during the machine learning process, the analysis model compares the predicted profile classification in the data value 181 to the actual profile classification as indicated by the data value 182. As set forth previously, the training set data 162 includes, for each set of historical magnetic field data, historical target profile data indicating the profile and classification that resulted from the corresponding historical thin-film deposition process. The analysis model 122 compares the predicted profile from the data value 181 to the predicted profile from the data value 182. The analysis model 122 generates an error value 183 indicating the error or difference between the predicted profile from the data value 181 and the predicted profile from the data value 182. The error value 183 is utilized to train the analysis model 122.

In some embodiments, the data value 183 is an aggregate error value. The aggregate error value 183 corresponds to the number of erroneous predictions for the training set data 162 during a single iteration of training. The training process adjusts the internal functions F(x) after each iteration with the goal of reducing the number of erroneous predictions until a threshold accuracy is achieved. In the example of a prediction of an entire target profile, the aggregate error value indicates the total error between all of the predicted profile targets and the actual profile targets. The training process continues until a threshold accuracy is achieved, corresponding to an aggregate error less than a threshold aggregate error.

The training of the analysis model 122 can be more fully understood by discussing the internal mathematical functions F(x). While all of the nodes 180 are labeled with an internal mathematical function F(x), the mathematical function F(x) of each node is unique. In one example, each internal mathematical function has the following form:

$$F(x) = x_1 * w_1 + x_2 * w_2 + \ldots x_n * w_1 + b.$$

In the equation above, each value $x_1$-$x_n$ corresponds to a data value received from a node 180 in the previous neural layer, or, in the case of the first neural layer 179$a$, each value $x_1$-$x_n$ corresponds to a respective data value from the data fields 178 of the magnetic field vector 177. Accordingly, n for a given node is equal to the number of nodes in the previous neural layer. The values $w_1$-$w_n$ are scalar weighting values associated with a corresponding node from the previous layer. The analysis model 122 selects the values of the weighting values $w_1$-$w_n$. The constant b is a scalar biasing value and may also be multiplied by a weighting value. The value generated by a node 180 is based on the weighting values $w_1$-$w_n$. Accordingly, each node 180 has n weighting values $w_1$-$w_n$. Though not shown above, each function F(x) may also include an activation function. The sum set forth in the equation above is multiplied by the activation function. Examples of activation functions can include rectified linear unit (ReLU) functions, sigmoid functions, hyperbolic tension functions, or other types of activation functions.

After the error value 183 has been calculated, the analysis model 122 adjusts the weighting values $w_1$-$w_n$ for the various nodes 180 of the various neural layers 179$a$-179$e$. After the analysis model 122 adjusts the weighting values $w_1$-$w_n$, the analysis model 122 again provides the magnetic field vector 177 to the input neural layer 179$a$. Because the weighting values are different for the various nodes 180 of the analysis model 122, the predicted profile 181 will be different than in the previous iteration. The analysis model 122 again generates an error value 183 by comparing the predicted profile 182 to the predicted profile 181.

The analysis model 122 again adjusts the weighting values $w_1$-$w_n$ associated with the various nodes 180. The analysis model 122 again processes the magnetic field vector 177 and generates a predicted profile 181 and associated error value 183. The training process includes adjusting the weighting values $w_1$-$w_n$ in iterations until the error value 183 is minimized.

FIG. 10 illustrates a single magnetic field vector 177 being passed to the analysis model 122. In practice, the training process includes passing a large number of magnetic field vectors 177 through the analysis model 122, generating a predicted profile 181 for each magnetic field vector 177, and generating associated error value 183 for each predicted profile. The training process can also include generating an aggregated error value indicating the average error for all the predicted profiles for a batch of magnetic field vectors 177. The analysis model 122 adjusts the weighting values $w_1$-$w_n$ after processing each batch of magnetic field vectors 177. The training process continues until the average error across all magnetic field vectors 177 is less than a selected threshold tolerance. When the average error is less than the selected threshold tolerance, the analysis model 122 training is complete and the analysis model is trained to accurately predict the thickness of thin-films based on the magnetic field distributions. The analysis model 122 can then be used to predict acceptable or unacceptable target profiles or to predict actual target profiles based on magnetic field distributions.

During use of the trained model 122, a magnetic field vector, representing current magnetic field distribution for a current thin-film deposition process being performed, and having the same format as the magnetic field vector 177, is provided to the trained analysis model 122. The trained analysis model 122 can then predict whether the target profile will be an acceptable or unacceptable or can predict the actual of the target will result from the thin-film deposition process. If the target profiles unacceptable, the control system 106 can stop the thin-film deposition process so that the magnetron can be adjusted or so that other maintenance can be performed.

A particular example of a neural network based analysis model 122 has been described in relation to FIG. 10. However, other types of neural network based analysis models, or analysis models of types other than neural networks can be utilized without departing from the scope of the present disclosure. Furthermore, the neural network can have different numbers of neural layers having different numbers of nodes without departing from the scope of the present disclosure.

Figure 11:
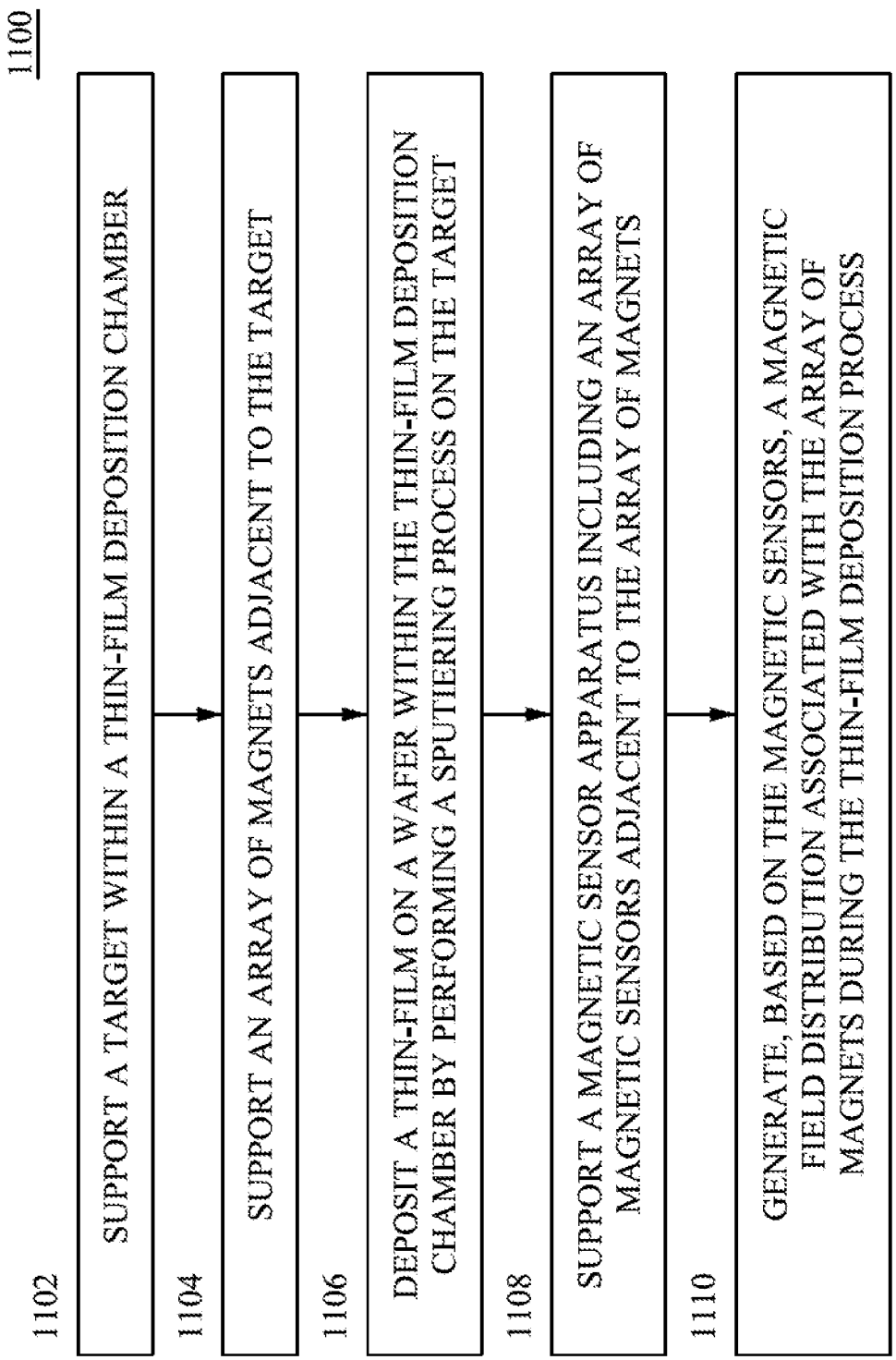
FIG. 11 is a flow diagram of a method for operating a thin-film deposition system, in accordance with some embodiments.

FIG. 11 is a flow diagram of a method 1100 for operating a thin-film deposition system, in accordance with some embodiments. The method 1100 can utilize processes, components, and systems, described in relation to FIGS. 1-10. At 1102, the method 1100 includes supporting a target within a thin-film deposition chamber. One example of a target is the target 107 of FIG. 1. One example of a thin film deposition chamber is the thin-film deposition chamber 102 of FIG. 1. At 1104, the method 1100 includes supporting an array of magnets adjacent to the target. One example of an array of magnets is the magnets 124 of FIG. 2. At 1106, the method 1100 includes depositing a thin-film on a wafer within the thin-film deposition chamber by performing a sputtering process on the target. One example of a wafer is the wafer 104 of FIG. 1. At 1108, the method 1100 includes supporting a magnetic sensor apparatus including an array of magnetic sensors adjacent to the array of magnets. One example of a magnetic sensor apparatus is the magnetic sensor apparatus 105 of FIG. 2. One example of magnetic sensors is the magnetic sensors 132 of FIG. 2. At 1110, the method 1100 includes generating, based on the magnetic sensors, a magnetic field distribution associated with the array of magnets during the thin-film deposition process. One example of a magnetic field distribution is the magnetic field distribution 155 of FIG. 7A.

Figure 12:
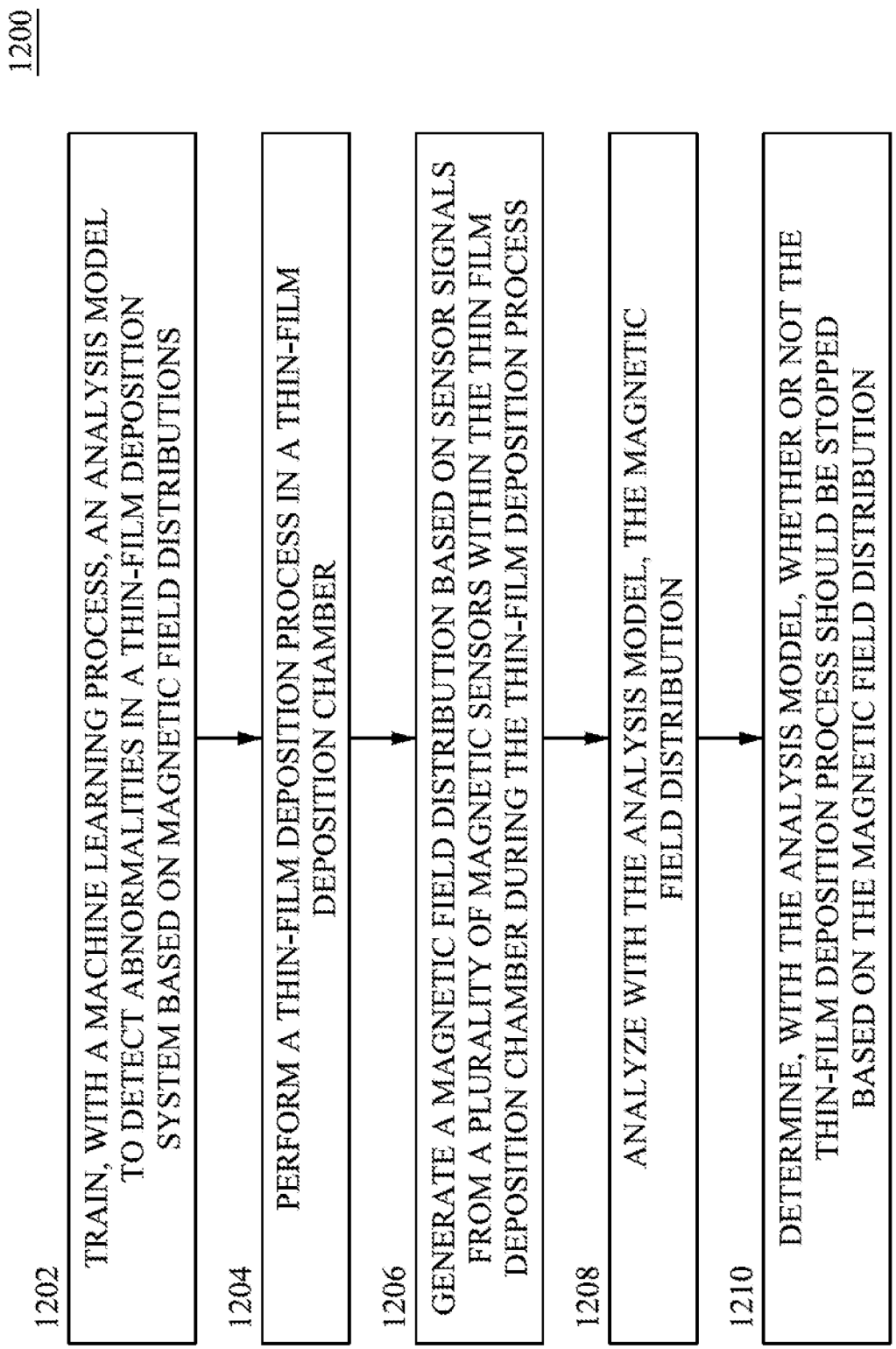
FIG. 12 is a flow diagram of a method for operating a thin-film deposition system, in accordance with some embodiments.

FIG. 12 is a flow diagram of a method 1200 for operating a thin-film deposition system, in accordance with some embodiments. The method 1200 can utilize processes, components, and systems described in relation to FIGS. 1-10. At 1202, the method 1200 includes training, with a machine learning process, an analysis model to detect abnormalities in a thin-film deposition system based on magnetic field distributions. One example of an analysis model is the analysis model 122 of FIG. 1. One example of a thin-film deposition system is the thin-film deposition system 100 of FIG. 1. At 1204, the method 1200 includes performing a thin-film deposition process in a thin-film deposition chamber. One example of a thin film deposition chamber is the thin-film deposition chamber 102 of FIG. 1. At 1206, the method 1200 includes generating, a magnetic field distribution based on sensor signals from a plurality of magnetic sensors within the thin film deposition chamber during the thin-film deposition process. One example the magnetic field distribution is the magnetic field distribution 155 of FIG. 7A. One example of magnetic sensors is the magnetic sensors 132 of FIG. 2. At 1208, the method 1200 includes analyzing, with the analysis model, the magnetic field distribution. One example of an analysis model is the analysis model 122 of FIG. 1. At 1210, the method 1200 includes determining, with the analysis model, whether or not the thin-film deposition process should be stopped based on the magnetic field distribution.

Embodiments of the present disclosure help ensure that a thin-film deposition system is functioning properly by measuring, in situ, magnetic fields within a thin-film deposition chamber during a thin-film deposition process. Embodiments of the present disclosure provide a magnetic sensor apparatus that can be placed within a thin-film deposition chamber in order to detect the magnetic field distribution within the thin-film deposition chamber. Embodiments of the present disclosure also utilize machine learning techniques to train an analysis model to determine whether thin-film deposition processes are working properly or not based on the magnetic field distribution within the thin-film deposition chamber.

The combination of the magnetic sensor apparatus and the analysis model provide several benefits. For example, the analysis model can detect when a thin-film deposition process is likely to be faulty based on the magnetic field distribution and can stop thin-film deposition processes to adjust deposition parameters. The result is that thin-film deposition processes produce thin-films having thicknesses and compositions that reliably fall within target specifications. This further results in improved function of integrated circuits that include the thin-films and improved wafer yields.

In one embodiment, a method includes supporting a target within a thin-film deposition chamber, supporting an array of magnets adjacent to the target, and depositing a thin-film on a wafer within the thin-film deposition chamber by performing a sputtering process on the target. The method includes supporting a magnetic sensor apparatus including an array of magnetic sensors adjacent to the array of magnets and generating, based on the magnetic sensors, a magnetic field distribution associated with the array of magnets during the thin-film deposition process.

In one embodiment, a method includes training, with a machine learning process, an analysis model to detect abnormalities in a thin-film deposition system based on magnetic field distributions, performing a thin-film deposition process in a thin-film deposition chamber, and generating, a magnetic field distribution based on sensor signals from a plurality of magnetic sensors within the thin film deposition chamber during the thin-film deposition process. The method includes analyzing, with the analysis model, the magnetic field distribution and determining, with the analysis model, whether or not the thin-film deposition process should be stopped based on the magnetic field distribution.

In one embodiment, a system includes a thin-film deposition chamber, a target support configured to support a target within the thin-film deposition chamber, and a wafer support configured to support a wafer within the thin-film deposition chamber. The system includes a magnetron assembly within the thin-film deposition chamber and a magnetic sensor apparatus adjacent to the magnetron assembly and including an array of magnetic sensors each configured to output respective sensor signals indicative of a magnetic field.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

The invention claimed is:

1. A method, comprising:
supporting a target within a thin-film deposition chamber;
supporting an array of magnets adjacent to the target;
depositing a thin-film on a wafer within the thin-film deposition chamber by performing a sputtering process on the target;
supporting a magnetic sensor apparatus including an array of magnetic sensors adjacent to the array of magnets;
generating, based on the magnetic sensors, a magnetic field distribution associated with the array of magnets during the thin-film deposition process; and
analyzing, during the thin-film deposition process, the magnetic field distribution with an analysis model trained with a machine learning process.

2. The method of claim 1, comprising determining, with the analysis model, whether or not the magnetic field distribution is abnormal.

3. The method of claim 2, comprising stopping, with a control system, the thin-film deposition process if the analysis model determines that the magnetic field distribution is abnormal.

4. The method of claim 3, comprising allowing the thin-film deposition process to continue if the magnetic field distribution is normal.

5. The method of claim 1, comprising:
rotating the array of magnets during the thin-film deposition process; and
generating the magnetic field distribution by utilizing, for each magnetic sensor, multiple magnetic field measurements taken throughout one or more rotations of the array of magnets.

6. The method of claim 5, comprising predicting a target profile of the target with the analysis model based on the magnetic field distribution.

7. The method of claim 6, wherein the target profile includes a distribution of peaks and valleys in the target.

8. The method of claim 1, wherein the analysis model includes a neural network.

9. The method of claim 1, wherein the thin-film deposition process is a physical vapor deposition process.

10. The method of claim 9, wherein the thin-film deposition process is a sputtering process.

11. A method, comprising:
    training, with a machine learning process, an analysis model to detect abnormalities in a thin-film deposition system based on magnetic field distributions;
    performing a thin-film deposition process in a thin-film deposition chamber;
    generating, a magnetic field distribution based on sensor signals from a plurality of magnetic sensors within the thin film deposition chamber during the thin-film deposition process;
    analyzing, with the analysis model, the magnetic field distribution; and
    determining, with the analysis model, whether or not the thin-film deposition process should be stopped based on the magnetic field distribution.

12. The method of claim 11, comprising:
    generating training set data including historical magnetic field distribution data and historical target data for a plurality of previously performed thin-film deposition processes; and
    training the analysis model with the training set data.

13. The method of claim 12, wherein the training set data includes labels indicating whether each target profile is acceptable or not.

14. The method of claim 11, wherein the thin-film deposition process includes:
    generating a magnetic field adjacent to a target within the thin-film deposition chamber with a magnetron assembly;
    supporting the magnetic sensors adjacent to the magnetron assembly;
    ionizing atoms within the thin-film deposition chamber by generating an electric field within the thin-film deposition chamber;
    ejecting material from the target with the atoms; and
    depositing the material on a wafer within the target.

15. The method of claim 11, wherein the analysis model includes a neural network.

16. The method of claim 11, wherein the thin-film deposition process is a physical vapor deposition process.

17. A system, comprising:
    a thin-film deposition chamber;
    a target support configured to support a target within the thin-film deposition chamber;
    a wafer support configured to support a wafer within the thin-film deposition chamber;
    a magnetron assembly within the thin-film deposition chamber; and
    a magnetic sensor apparatus adjacent to the magnetron assembly and including an array of magnetic sensors each configured to output respective sensor signals indicative of a magnetic field, wherein the magnetic sensor apparatus includes:
        a baseplate; and
        a top plate, wherein the magnetic sensors are positioned between the baseplate and the top plate.

18. The system of claim 17, comprising a control system configured to generate a magnetic field distribution during a thin-film deposition process based on the sensor signals.

19. The system of claim 18, wherein the control system includes an analysis model trained with a machine learning process to analyze the magnetic field distribution and to determine whether or not the thin-film deposition process should be stopped based on the sensor data.

20. The system of claim 17, wherein the baseplate includes a plurality of apertures, wherein a sensing end of each magnetic sensor is positioned in a respective aperture.

* * * * *